US008512578B2

(12) United States Patent
Cohen et al.

(10) Patent No.: US 8,512,578 B2
(45) Date of Patent: *Aug. 20, 2013

(54) MULTI-STEP RELEASE METHOD FOR ELECTROCHEMICALLY FABRICATED STRUCTURES

(75) Inventors: Adam L. Cohen, Los Angeles, CA (US); Michael S. Lockard, Lake Elizabeth, CA (US); Dale S. McPherson, Burbank, CA (US)

(73) Assignee: Microfabrica Inc., Van Nuys, CA (US)

( * ) Notice: Subject to any disclaimer, the term of this patent is extended or adjusted under 35 U.S.C. 154(b) by 283 days.

This patent is subject to a terminal disclaimer.

(21) Appl. No.: 12/892,734

(22) Filed: Sep. 28, 2010

(65) Prior Publication Data

US 2011/0073479 A1 Mar. 31, 2011

Related U.S. Application Data

(63) Continuation of application No. 11/928,061, filed on Oct. 30, 2007, now abandoned, which is a continuation of application No. 10/841,347, filed on May 7, 2004, now abandoned, which is a continuation-in-part of application No. 10/434,497, filed on May 7, 2003, now Pat. No. 7,303,663, and a continuation-in-part of application No. 10/607,931, filed on Jun. 27, 2003, now Pat. No. 7,239,219, said application No. 10/607,931 is a continuation-in-part of application No. 10/309,521, filed on Dec. 3, 2002, now Pat. No. 7,259,640, and a continuation-in-part of application No. 10/434,103, filed on May 7, 2003, now Pat. No. 7,160,429, and a continuation-in-part of application No. 10/434,295, filed on May 7, 2003, now abandoned, and a continuation-in-part of application No. 10/434,519, filed on May 7, 2003, now Pat. No. 7,252,861.

(60) Provisional application No. 60/379,184, filed on May 7, 2002, provisional application No. 60/392,531, filed on Jun. 27, 2002, provisional application No. 60/415,374, filed on Oct. 1, 2002, provisional application No. 60/464,504, filed on Apr. 21, 2003, provisional application No. 60/476,554, filed on Jun. 6, 2003, provisional application No. 60/338,638, filed on Dec. 3, 2001, provisional application No. 60/340,372, filed on Dec. 6, 2001, provisional application No. 60/379,133, filed on May 7, 2002, provisional application No. 60/379,182, filed on May 7, 2002, provisional application No. 60/379,130, filed on May 7, 2002, provisional application No. 60/430,809, filed on Dec. 2, 2002.

(51) Int. Cl.
*C25D 5/02* (2006.01)
*B81C 1/00* (2006.01)

(52) U.S. Cl.
USPC ........ 216/2; 216/13; 216/38; 216/56; 216/83; 216/96; 205/118; 205/223

(58) Field of Classification Search
None
See application file for complete search history.

(56) References Cited

U.S. PATENT DOCUMENTS

| | | | |
|---|---|---|---|
| 4,058,432 A | 11/1977 | Schuster-Woldan et al. | |
| 5,190,637 A | 3/1993 | Guckel | |
| 5,685,491 A | 11/1997 | Marks et al. | |
| 6,027,630 A | 2/2000 | Cohen | |
| 7,160,429 B2 * | 1/2007 | Cohen et al. | 205/220 |
| 7,239,219 B2 | 7/2007 | Brown et al. | |
| 7,259,640 B2 | 8/2007 | Brown et al. | |
| 7,303,663 B2 * | 12/2007 | Cohen et al. | 205/118 |
| 7,384,530 B2 * | 6/2008 | Cohen et al. | 205/118 |
| 7,488,686 B2 * | 2/2009 | Cohen et al. | 438/697 |
| 2001/0014409 A1 | 8/2001 | Cohen | |
| 2004/0028849 A1 * | 2/2004 | Stark et al. | 428/34.1 |
| 2009/0194425 A1 * | 8/2009 | Cohen et al. | 205/123 |

OTHER PUBLICATIONS

Cohen, et al., "EFAB: Batch Production of Functional, Fully-Dense Metal Parts with Micron-Scale Features", Proc. $9^{th}$ Solid Freeform Fabrication, The University of Texas at Austin, Aug. 1998, pp. 161.
Adam L. Cohen, et al., "EFAB: Rapid, Low-Cost Desktop Micromachining of High Aspect Ratio True 3-D MEMS", Proc. $12^{th}$ IEEE Micro Electro Mechanical Systems Workshop, IEEE, Jan. 17-21, 1999, pp. 244-251.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. $2^{nd}$ International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", $3^{rd}$ International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

"Microfabrication—Rapid Prototyping's Killer Application", Rapid Prototyping Report, CAD/CAM Publishing, Inc., Jun. 1999, pp. 1-5.

* cited by examiner

*Primary Examiner* — Anita Alanko
(74) *Attorney, Agent, or Firm* — Dennis R. Smalley

(57) ABSTRACT

Multi-layer structures are electrochemically fabricated from at least one structural material (e.g. nickel), that is configured to define a desired structure and which may be attached to a substrate, and from at least one sacrificial material (e.g. copper) that surrounds the desired structure. After structure formation, the sacrificial material is removed by a multi-stage etching operation. In some embodiments sacrificial material to be removed may be located within passages or the like on a substrate or within an add-on component. The multi-stage etching operations may be separated by intermediate post processing activities, they may be separated by cleaning operations, or barrier material removal operations, or the like. Barriers may be fixed in position by contact with structural material or with a substrate or they may be solely fixed in position by sacrificial material and are thus free to be removed after all retaining sacrificial material is etched.

18 Claims, 16 Drawing Sheets

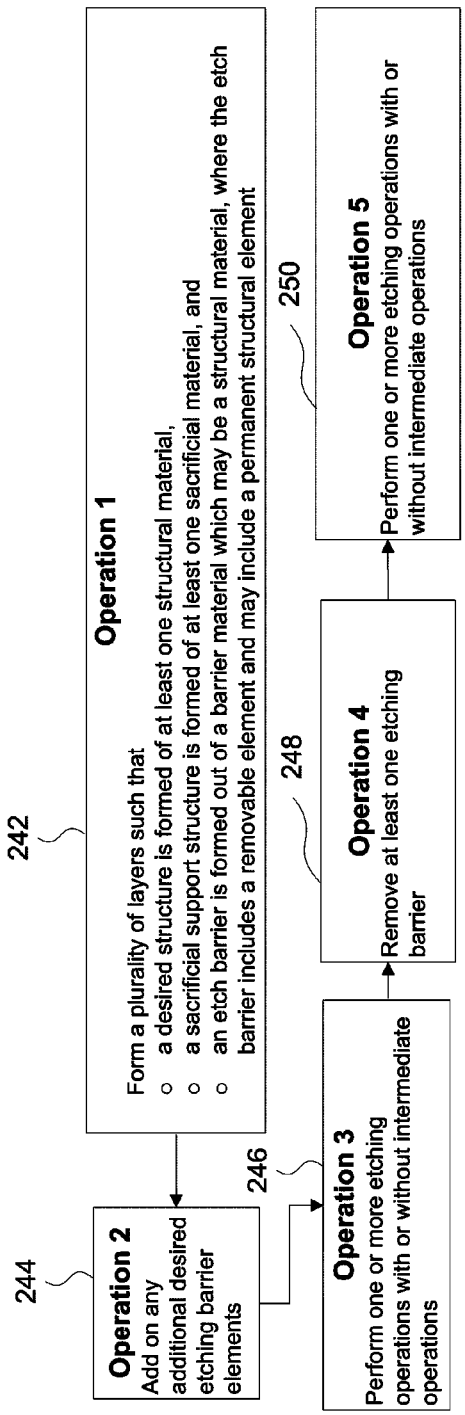
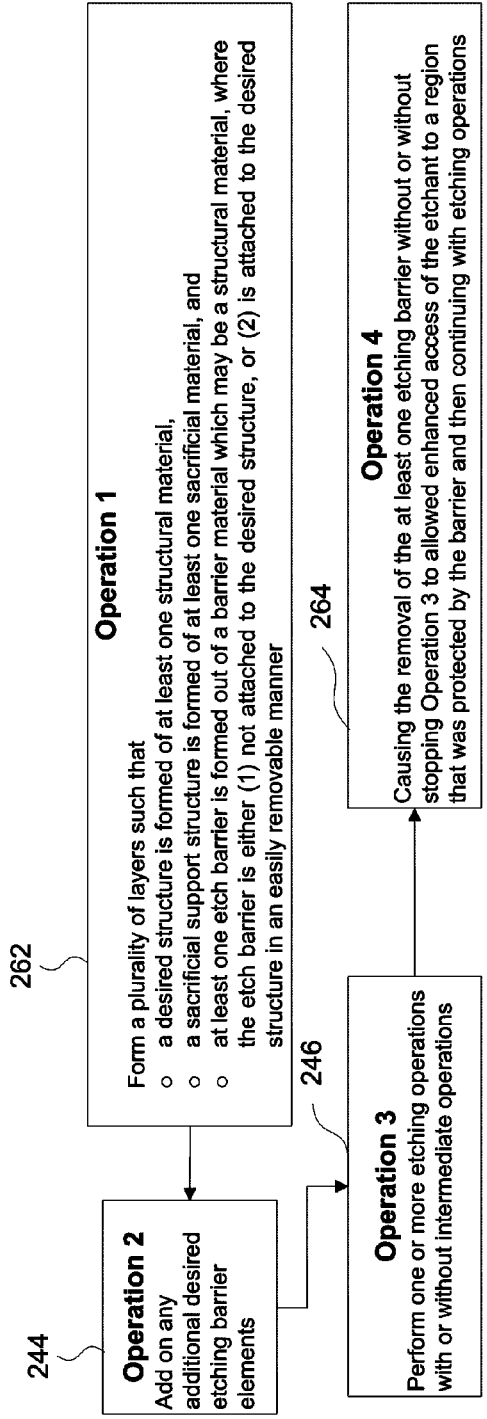
Figure 10(a)
Figure 10(b)

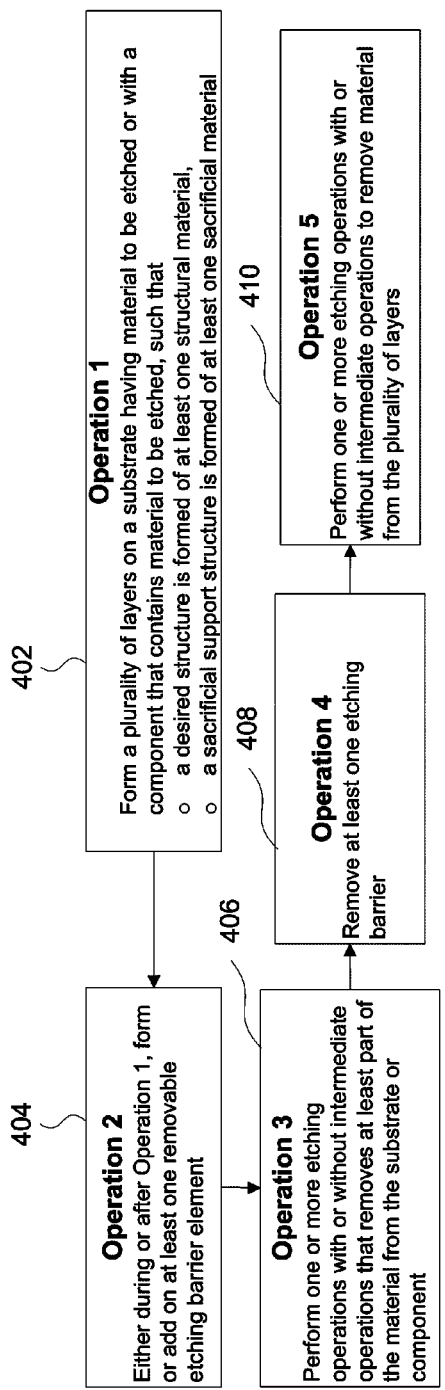
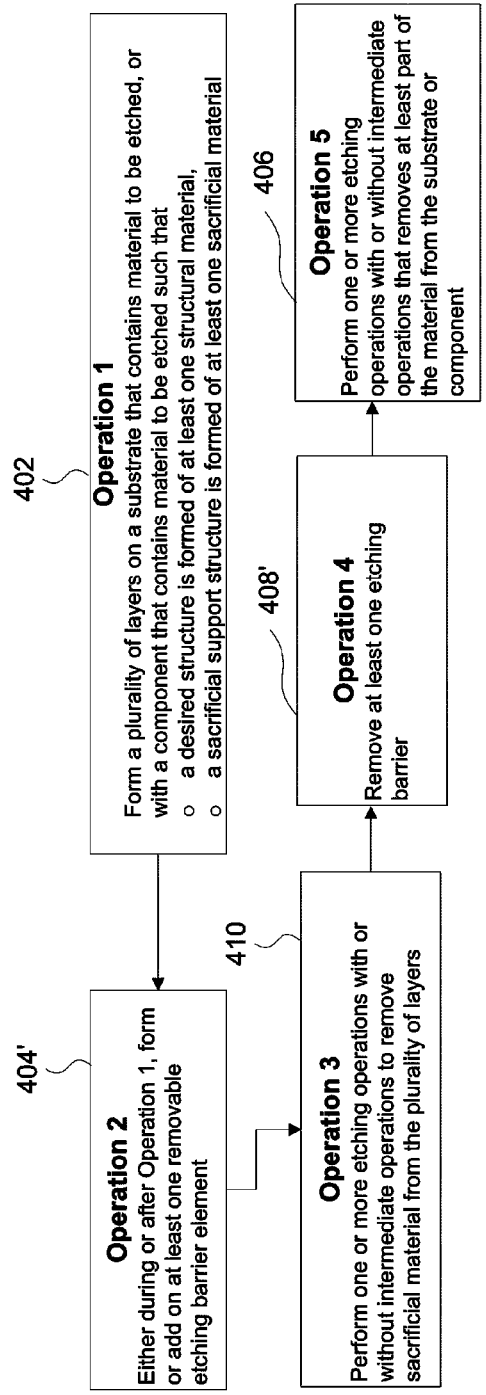
Figure 18(a)
Figure 18(b)

US 8,512,578 B2

MULTI-STEP RELEASE METHOD FOR ELECTROCHEMICALLY FABRICATED STRUCTURES

RELATED APPLICATIONS

This application is a continuation of U.S. patent application Ser. No. 11/928,061, filed Oct. 30, 2007 now abandoned. The '061 application is a continuation of U.S. patent application Ser. No. 10/841,347, filed May 7, 2004 now abandoned. The '347 application is a continuation-in-part of U.S. patent application Ser. Nos. 10/434,497, filed May 7, 2003, now U.S. Pat. No. 7,303,663, and Ser. No. 10/607,931, filed Jun. 27, 2003, now U.S. Pat. No. 7,239,219. The '497 application claims benefit of U.S. Provisional Patent Application No. 60/379,184, filed May 7, 2002, and No. 60/392,531, filed Jun. 27, 2002. The '931 application claims benefit of U.S. Provisional Patent Application Nos. 60/392,531, filed Jun. 27, 2002; 60/415,374, filed Oct. 1, 2002; 60/464,504, filed Apr. 21, 2003; and 60/476,554, filed on Jun. 6, 2003. The '931 application is also a continuation-in-part of U.S. patent application Ser. Nos. 10/309,521, filed on Dec. 3, 2002 now U.S. Pat. No. 7,259,640; 10/434,497, filed May 7, 2003; 10/434,103, filed May 7, 2003 now U.S. Pat. No. 7,160,429; 10/434,295, filed May 7, 2003 now abandoned; and 10/434,519, filed on May 7, 2003 now U.S. Pat. No. 7,252,861. The '521 application claims benefit of U.S. Provisional Patent Application Nos. 60/338,638, filed on Dec. 3, 2001; 60/340,372, filed on Dec. 6, 2001; 60/379,133, filed on May 7, 2002; 60/379,182, filed on May 7, 2002; 60/379,184, filed on May 7, 2002; 60/415,374, filed on Oct. 1, 2002; 60/379,130, filed on May 7, 2002; and 60/392,531, filed on Jun. 27, 2002. The '497 application claims benefit of U.S. Provisional Patent Application Nos. 60/379,184, filed May 7, 2002; and 60/392,531, filed Jun. 27, 2002. The '103 application claims benefit of U.S. Provisional Patent Application Nos. 60/379,182, filed May 7, 2002; and 60/430,809, filed Dec. 2, 2002. The '295 application claims benefit of U.S. Provisional Patent Application No. 60/379,133, filed May 7, 2002. The '519 application claims benefit of U.S. Provisional Patent Application No. 60/379,130, filed May 7, 2002. Each of these priority applications is incorporated herein by reference as if set forth in full.

FIELD OF THE INVENTION

The present invention relates generally to the field of electrochemical fabrication and the associated formation of three-dimensional structures via a layer-by-layer build up of deposited materials. In particular, it relates to the formation of microstructures embedded in sacrificial material and the release of those microstructures from the sacrificial materials via two or more distinct etching operations.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica™ Inc. (formerly MEMGen® Corporation) of Burbank, Calif. under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica™ Inc. (formerly MEMGen® Corporation) of Burbank, Calif. such masks have come to be known as INSTANT MASKS™ and the process known as INSTANT MASKING or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST '99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) "Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein. The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1($a$)-1($c$). FIG. 1($a$) shows a side view of a CC mask 8 consisting of a conformable or deformable (e.g. elastomeric) insulator 10 patterned on an anode 12. The anode has two functions. FIG. 1($a$) also depicts a substrate 6 separated from mask 8. One is as a supporting material for the patterned insulator 10 to maintain its integrity and alignment since the pattern may be topologically complex (e.g., involving isolated "islands" of insulator material). The other function is as an anode for the electroplating operation. CC mask plating selectively deposits material 22 onto a substrate 6 by simply pressing the insulator against the substrate then electrodepositing material through apertures 26$a$ and 26$b$ in the insulator as shown in FIG. 1($b$). After deposition, the CC mask is separated, preferably non-destructively, from the substrate 6 as shown in FIG. 1($c$). The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1($d$)-1($f$). FIG. 1($d$) shows an anode 12' separated from a mask 8' that includes a patterned conformable material 10' and a support structure 20. FIG. 1($d$) also depicts substrate 6 separated from the mask 8'. FIG. 1($e$) illustrates the mask 8' being brought into contact with the substrate 6. FIG. 1($f$) illustrates the deposit 22' that results from conducting a current from the anode 12' to the substrate 6. FIG. 1($g$) illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2($a$)-2($f$). These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2(a), illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2(b). FIG. 2(c) depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2(d). After repetition of this process for all layers, the multi-layer structure 20 formed of the second material 4 (i.e. structural material) is embedded in first material 2 (i.e. sacrificial material) as shown in FIG. 2(e). The embedded structure is etched to yield the desired device, i.e. structure 20, as shown in FIG. 2(f).

Various components of an exemplary manual electrochemical fabrication system 32 are shown in FIGS. 3(a)-3(c). The system 32 consists of several subsystems 34, 36, 38, and 40. The substrate holding subsystem 34 is depicted in the upper portions of each of FIGS. 3(a) to 3(c) and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3(a) includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3(b) and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3(c) and includes a lapping plate 52 and associated motion and control systems (not shown) for planarizing the depositions.

In addition to the above teachings, the '630 patent indicates that electroplating methods can be used in combination with insulating materials. In particular it indicates that though the electroplating methods have been described with respect to two metals, a variety of materials, e.g., polymers, ceramics and semiconductor materials, and any number of metals can be deposited either by the electroplating methods described, or in separate processes that occur throughout the electroplating method. It further indicates that a thin plating base can be deposited, e.g., by sputtering, over a deposit that is insufficiently conductive (e.g., an insulating layer) so as to enable continued electroplating. It even further indicates that multiple support materials can be included in the electroplated element allowing selective removal of the support materials.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Even in view of these teaching, a need remains in the electrochemical fabrication arts for techniques that can improve production reliability, enhance control of post-layer fabrication process operations, ease post layer fabrication handling, and even overcome process defects that might otherwise result in production failures.

SUMMARY OF THE INVENTION

An object of some embodiments of various aspects of the invention is to improve electrochemical fabrication production reliability.

An object of some embodiments of various aspects of the invention is to enhance control of post-layer fabrication process control, overcome process defects that would otherwise result in production failures.

An object of some embodiments of various aspects of the invention is to ease post-layer fabrication handling.

An object of some embodiments of various aspects of the invention is to overcome process defects that might otherwise result in production failures.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively it may not address any of the objects set forth above but instead address some other object of the invention which may be ascertained from the teachings herein. It is not intended that all of these objects be addressed by any single aspect of the invention even though that may be the case with regard to some aspects.

A first aspect of the invention provides an electrochemical fabrication process for producing a multi-layer three-dimensional structure from a plurality of adhered layers, the process including: (A) forming a layer by depositing at least one sacrificial material and at least one structural material onto a substrate, wherein the substrate may include previously deposited layers, and wherein the depositing of at least one of the materials includes an electrodeposition operation; (B) repeating (A) one or more times such that a plurality of layers are formed and such that successive layers are formed adjacent to and adhered to previously formed layers; (C) performing a first etching operation to remove at least a first portion of at least one material from the plurality of layers or from the substrate; and (D) performing a second etching operation, which is distinct from the first etching operation, to remove at least a portion of at least one material from the plurality of layer or from the substrate.

A second aspect of the invention provides an electrochemical fabrication process for producing a three-dimensional structure from a plurality of adhered layers, the process including: (A) forming a layer by depositing at least one sacrificial material and at least one structural material onto a substrate, wherein the substrate may include previously deposited layers, and wherein the depositing of at least one of the materials includes an electrodeposition operation; (B) repeating (A) one or more times such that a plurality of layers are formed and such that successive layers are formed adjacent to and adhered to previously formed layers; (C) performing a first etching operation to remove at least a first portion of at least one material from the plurality of layers or from the substrate; (D) performing an intervening operation, after performing the first etching operation; (E) performing a second etching operation, after the intervening operation, to remove at least a portion of at least one material from the plurality of layer or from the substrate.

Further aspects of the invention will be understood by those of skill in the art upon reviewing the teachings herein. Other aspects of the invention may involve combinations of the above noted aspects of the invention and/or addition of various features of one or more embodiments. Other aspects of the invention may involve apparatus that are configured to implement one or more of the above method aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 10(a) and 10(b) depict block diagrams of a fourth and fifth group of embodiments.

FIG. 17(a) depicts an end view of one of the coaxial arms of the device and etching barrier of FIGS. 15 and 16 while

FIGS. 18(a) and 18(b) depict block diagrams of process operations associated with sixth and seventh groups of embodiments.

DETAILED DESCRIPTION

FIGS. 1(a)-1(g), 2(a)-2(f), and 3(a)-3(c) illustrate various features of one form of electrochemical fabrication that are known. Other electrochemical fabrication techniques are set forth in the '630 patent referenced above, in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention explicitly set forth herein to yield enhanced embodiments. Still other embodiments may be derived from combinations of the various embodiments explicitly set forth herein.

Figure 1A:
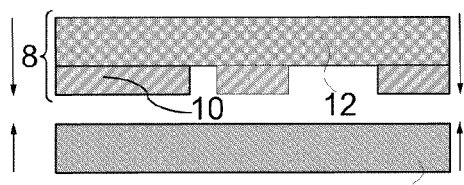
FIGS. 1(a)-1(c) schematically depict side views of various stages of a CC mask plating process, while FIGS. 1(d)-(g) schematically depict a side views of various stages of a CC mask plating process using a different type of CC mask.
Figure 1B:
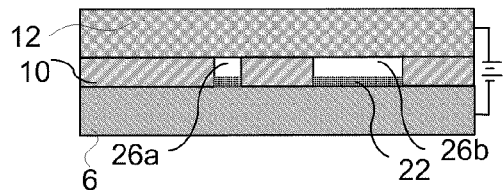
Figure 1C:
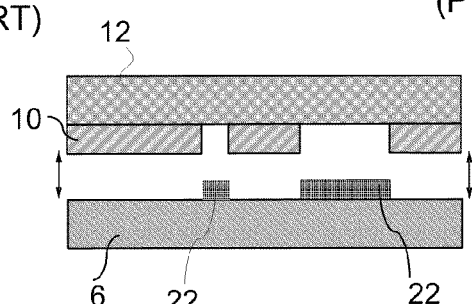
Figure 1D:
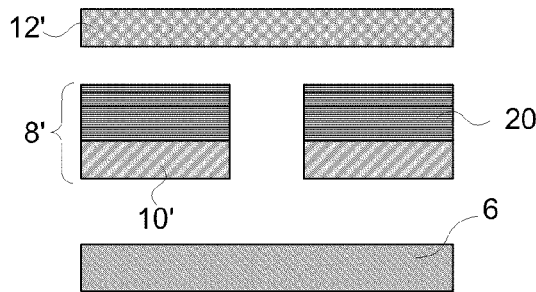
Figure 1E:
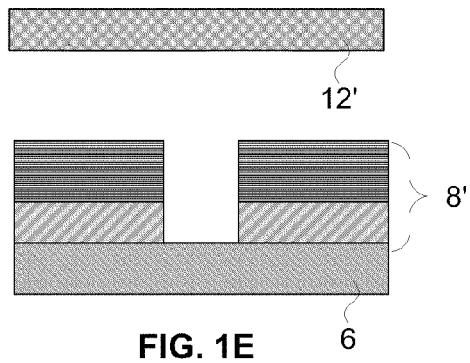
Figure 1F:
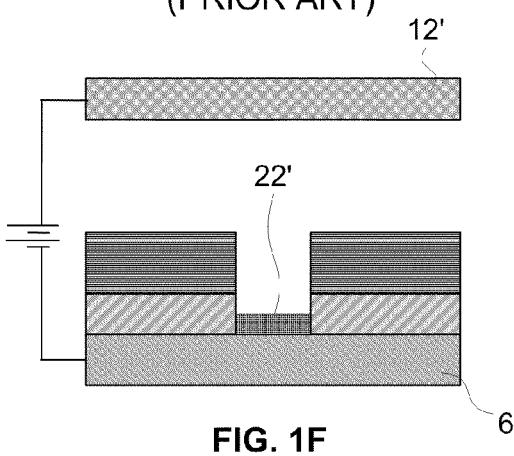
Figure 1G:
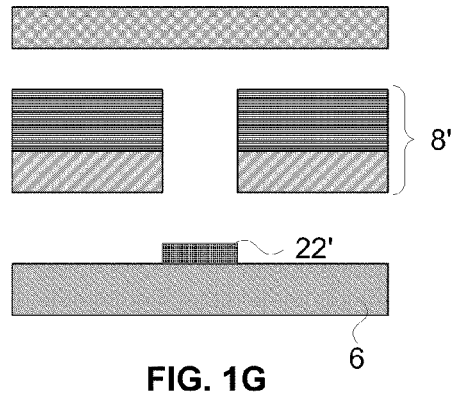
Figure 2A:
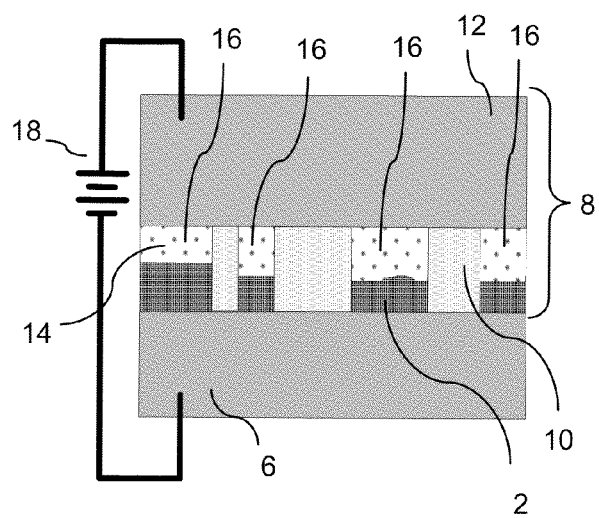
FIGS. 2(a)-2(f) schematically depict side views of various stages of an electrochemical fabrication process as applied to the formation of a particular structure where a sacrificial material is selectively deposited while a structural material is blanket deposited.
Figure 2B:
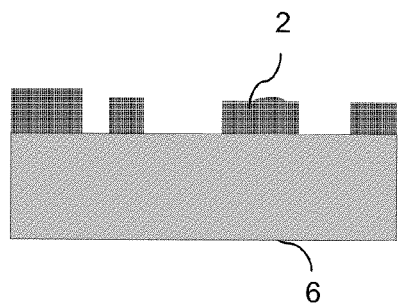
Figure 2C:
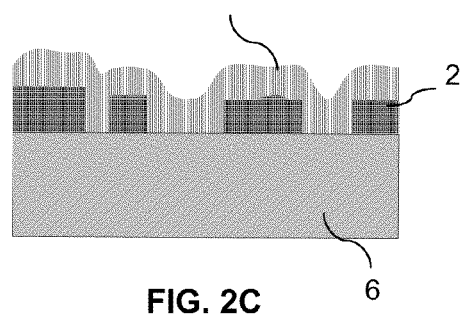
Figure 2D:
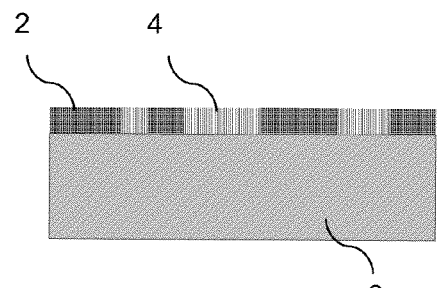
Figure 2E:
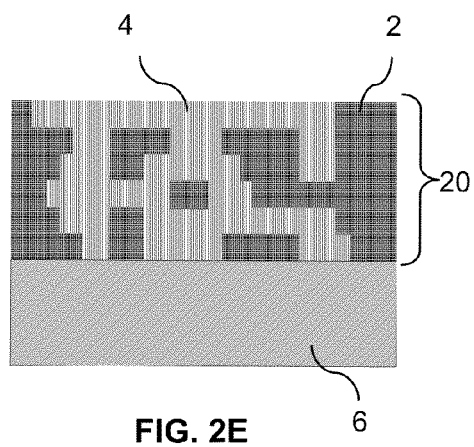
Figure 2F:
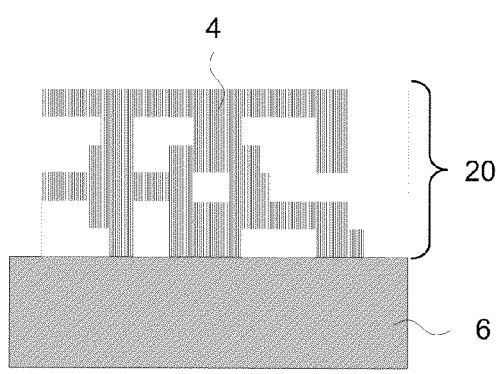
Figure 3A:
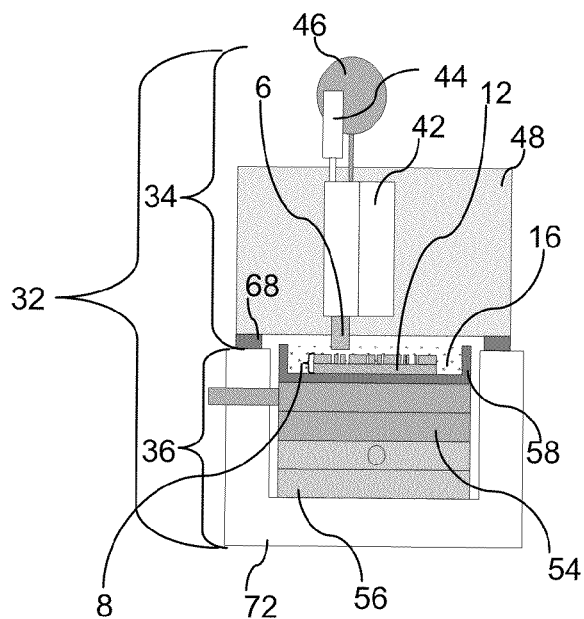
FIGS. 3(a)-3(c) schematically depict side views of various example subassemblies that may be used in manually implementing the electrochemical fabrication method depicted in FIGS. 2(a)-2(f).
Figure 3B:
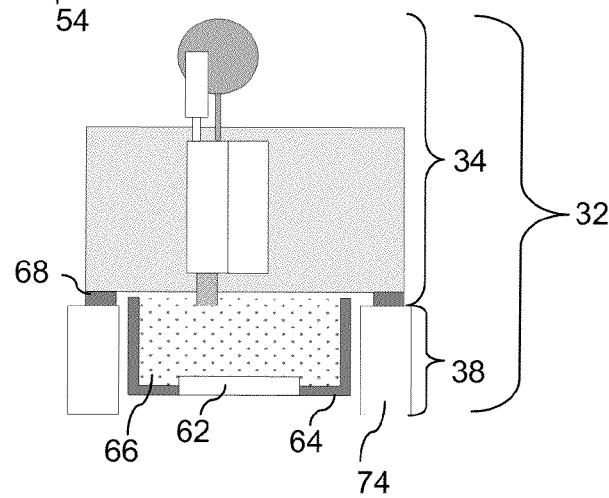
Figure 3C:
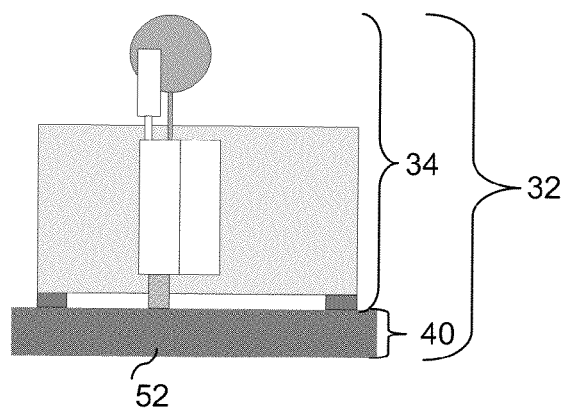
Figure 4A:
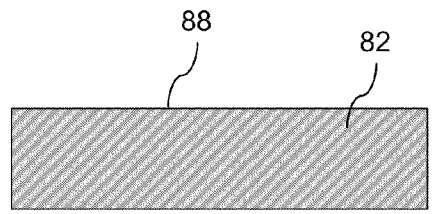
FIGS. 4(a)-4(i) schematically depict the formation of a first layer of a structure using adhered mask plating where the blanket deposition of a second material overlays both the openings between deposition locations of a first material and the first material itself.
Figure 4B:
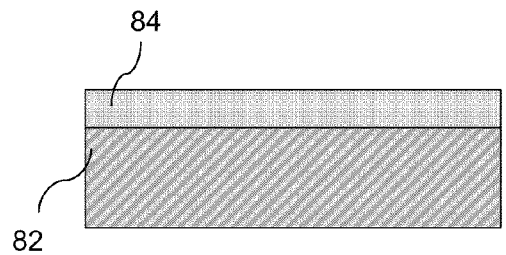
Figure 4C:
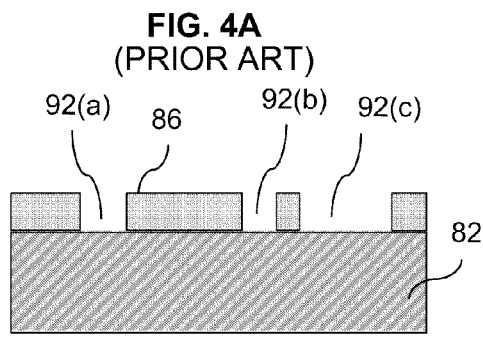
Figure 4D:
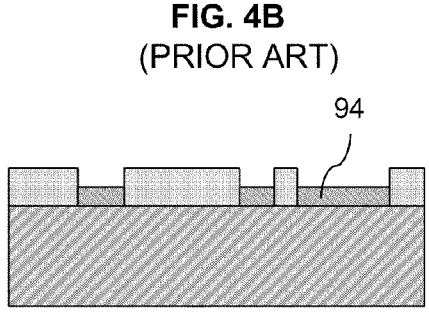
Figure 4E:
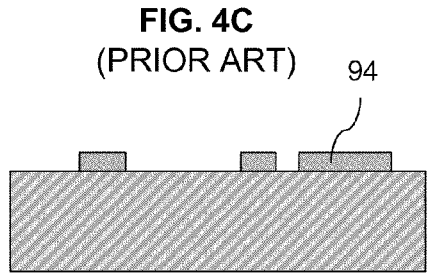
Figure 4F:
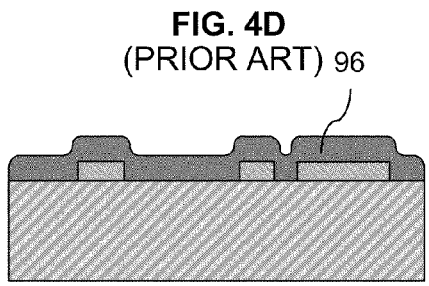
Figure 4G:
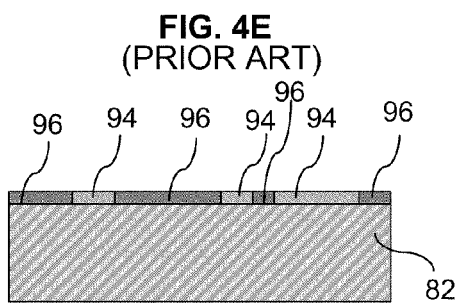
Figure 4H:
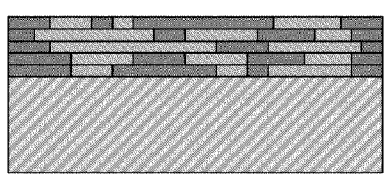
Figure 4I:
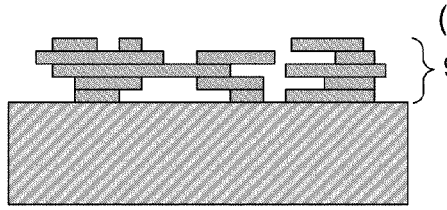

FIGS. 4(a)-4(i) illustrate various stages in the formation of a single layer of a multi-layer fabrication process where a second metal is deposited on a first metal as well as in openings in the first metal where its deposition forms part of the layer. In FIG. 4(a), a side view of a substrate 82 is shown, onto which patternable photoresist 84 is cast as shown in FIG. 4(b). In FIG. 4(c), a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4(d), a metal 94 (e.g. nickel) is shown as having been electroplated into the openings 92(a)-92(c). In FIG. 4(e), the photoresist has been removed (i.e. chemically stripped) from the substrate to expose regions of the substrate 82 which are not covered with the first metal 94. In FIG. 4(f), a second metal 96 (e.g., silver) is shown as having been blanket electroplated over the entire exposed portions of the substrate 82 (which is conductive) and over the first metal 94 (which is also conductive). FIG. 4(g) depicts the completed first layer of the structure which has resulted from the planarization of the first and second metals down to a height that exposes the first metal and sets a thickness for the first layer. In FIG. 4(h) the result of repeating the process operations shown in FIGS. 4(b)-4(g) several times to form a multi-layer structure are shown where each layer consists of two materials. For most applications, one of these materials is removed as shown in FIG. 4(i) to yield a desired 3-D structure 98 (e.g. component or device).

The various embodiments, alternatives, and techniques disclosed herein may be used in combination with electrochemical fabrication techniques that use different types of patterning masks and masking techniques. For example, conformable contact masks and masking operations may be used, proximity masks and masking operations (i.e. operations that use masks that at least partially selectively shield a substrate by their proximity to the substrate even if contact is not made) may be used, non-conformable masks and masking operations (i.e. masks and operations based on masks whose contact surfaces are not significantly conformable) may be used, and adhered masks and masking operations (masks and operations that use masks that are adhered to a substrate onto which selective deposition or etching is to occur as opposed to only being contacted to it) may be used.

Figure 5A:
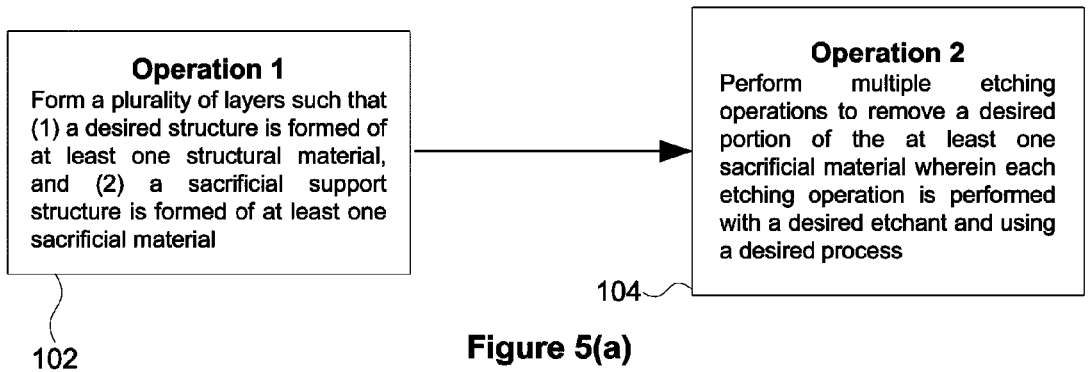
FIG. 5(a) depicts a block diagram of the basic operations of a first group of embodiments.

FIG. 5(a) depicts a block diagram of the basic elements or operations of a first group of embodiments. Block 102 indicates that in a first operation (i.e. Operation 1) a plurality of layers will be formed (e.g. by electrochemical fabrication) and that the layers will include: (1) a desired structure that is formed from at least one structural material, and (2) a sacrificial support structure that is formed from at least one sacrificial material. Block 104 indicates that a second operation (i.e. Operation 2) will include the performance of a plurality of etching operations for the purpose of removing a desired portion of the at least one sacrificial material wherein each etching operation is performed with a desired etchant and a desired process. In the present application, some embodiments involve use of two or more etching operations with each separated from the other by at least one "hard stop" (i.e. fixed or substantially fixed end points for results of the etching operations). Other embodiments will distinguish successive etching operations without use of hard stops.

Figure 5B:
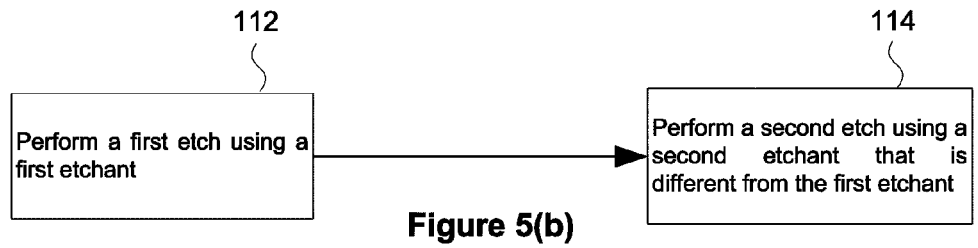
FIGS. 5(b)-5(d) depict block diagrams expanding on samples of alternatives for Operation 2 of FIG. 5.
Figure 5C:
Figure 5D:
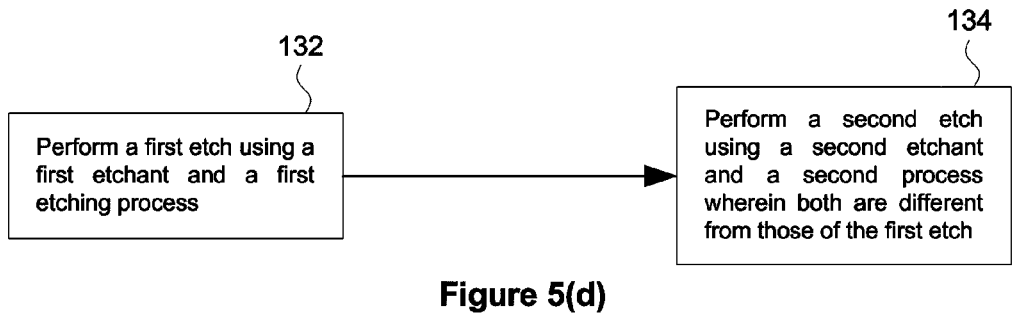

FIGS. 5(b)-5(d) depict block diagrams expanding on examples of various alternative embodiments for Operation 2 of FIG. 5(a). In FIG. 5(b), it is indicated that Operation 2 includes at least two elements: (1) a first etch using a first etchant, 112, and (2) a second etch using a second etchant that is different from the first etchant, 114. In the embodiment of FIG. 5(b), the two processes may be the same with the exception of the etchant used. In FIG. 5(c), it is indicated that Operation 2 includes at least two elements: (1) a first etch using an etchant and a first process, 122, and (2) a second etch using an etchant and a second process that is different from the first process, 124. In the embodiment of FIG. 5(c), the two etchants may be the same. In FIG. 5(d), it is indicated that Operation 2 includes at least two elements: (1) a first etch using a first etchant and a first etchant process, 132, and (2) a second etch using a second etchant and a second process, 134, wherein the second etchant is different from the first etchant and the first etching process is different from the second process. For the purposes of the present application varying the time of etching is not considered to constitute a different etching process, but varying the temperature, varying the type of or lack of agitation, or flow used, varying the concentration of etchant significantly, varying additives included in the etchant, or varying other parameters would constitute use of a different process.

Figure 6A:
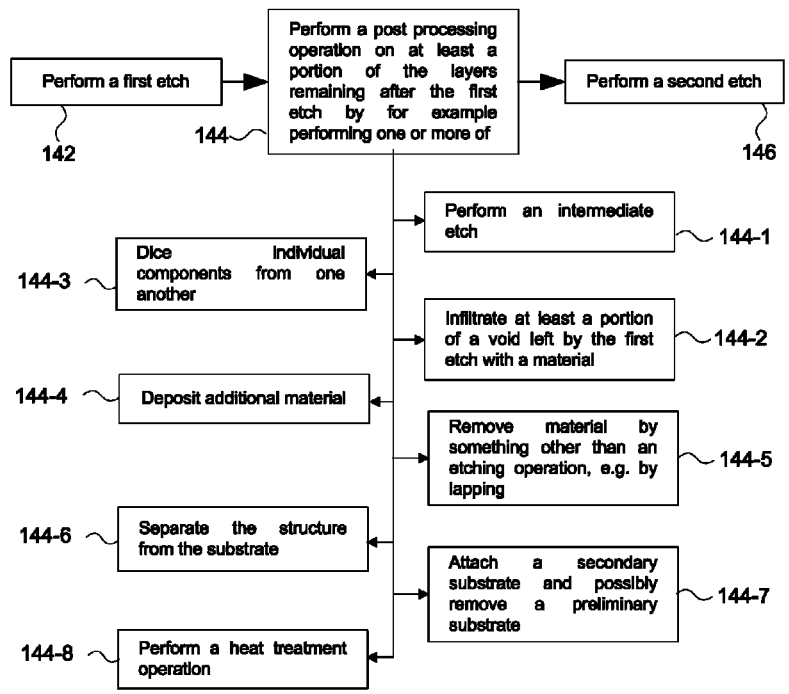
FIG. 6(a) depicts a block diagram for a second group of embodiments.

In FIG. 6(a), it is indicated that Operation 2 includes at least three elements: (1) a first etch, 142, (2) performance of a post processing operation on at least a portion of the layers remaining after the first etch, 144, and (3) a second etch. FIG. 6(a) further provides eight examples of what might be involved in performance of the second task 144: (A) the performance of an intermediate etch, 144-1, using a different etchant, a different process, or both operating on the same or a different material than that operated on by the first etchant (B) the infiltration of at least a portion of a void left by the first etch with a material, 144-2, (C) dicing of individual components to separate them from one another, 144-3, (D) deposition of additional material, 144-4; (E) removal of some material by other than an etching operation, such as a planarization operation, 144-5; (F) separating the structure from the substrate on which it was formed, 144-6; (G) attaching a secondary substrate or component and possibly removing the substrate on which the structure was formed, 144-7; and/or (H) performing a heat treatment operation, 144-8. Of course many other possible intermediate operations will be readily apparent to those of skill in the art upon review of the teachings herein.

Figure 6B:
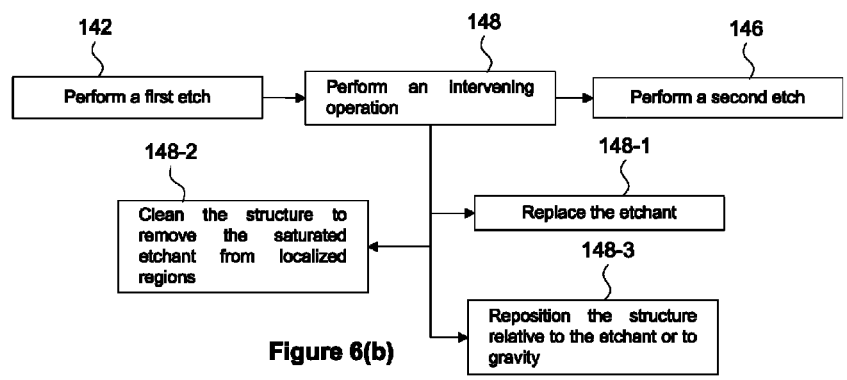
FIG. 6(b) depicts a block diagram for a third group of embodiments.

In FIG. 6(b) it is indicated that Operation 2 includes at least three elements: (1) a first etch, 142, (2) performance of an intervening non-post-processing task, 148, and (3) a second etch, 146. FIG. 6(b) further provides three examples of what might be involved in the performance of the intervening task 148: (A) replacement of the etchant that is being used, 148-1; (B) cleaning of the structure to remove saturated etchant from localized regions, 148-2; and/or (C) repositioning the structure with respect to the etchant, e.g. by rotating it with respect to gravity to improve efficiency, by exposing a different portion of the structure to the etchant or extracting a portion of the structure from the etchant, and the like, 148-3. The cleaning noted in (B) may take the form of a rinse in distilled water, or other substance that may facilitate removal of the saturated etchant. It may include agitation of the structure or directed streams of a cleaning solution.

Examples of various circumstances in which some of the above embodiments might be practiced are illustrated in FIGS. 7(a)-7(d), 8(a)-8(c), and 9(a)-9(c).

FIGS. 7(a)-7(d) illustrate an example where a single structural material is used in combination with a single sacrificial material. In this embodiment the desired multi-layer structure 202 is surrounded by three levels of material. The multi-layer structure 202 is initially surrounded by a first region of the sacrificial material 204 (with the exception of where the structure contacts the substrate 210. The first region of sacrificial material 204 is surrounded by a barrier 206 (e.g. a thin barrier) of the structural material (with the exception of where it contacts the substrate 210). A barrier 206 is in turn surrounded by a second region of the sacrificial material 208 (with the exception of where it contacts the substrate 210).

The first and second regions of sacrificial material 204 and 208, respectively, may be a consequence of the process that was used to build up the layers (e.g. the lateral build dimensions may have fixed extents regardless of the lateral dimensions of the desired structure 202 and as such what is not part of the desired structure may generally be formed of sacrificial material). In the present embodiment the barrier 206 was formed to allow a controlled etch stop to exist when the etching of region 208 occurs.

Figure 7A:
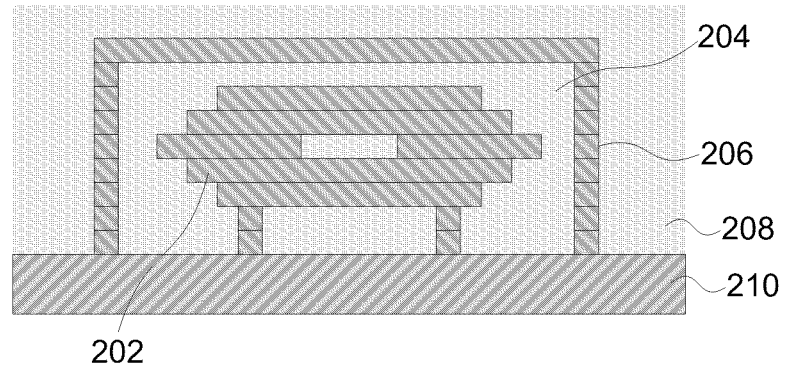
FIGS. 7(a)-7(d) schematically provide side views illustrating various stages of an embodiment of FIG. 6(a) as applied to a specific group of layers.
Figure 7B:
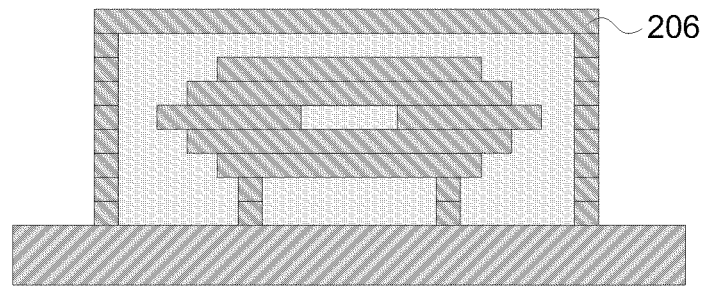

Such a stop may be desirable for a variety of reasons. For example, if the etchant used to remove the sacrificial material doesn't have high enough selectively for removing the sacrificial material as compared to the structural material, regions of the structural material exposed to the structural material etchant for longer periods of time or with higher levels of agitations and the like, may suffer unacceptable levels of damage while structural material regions exposed to the etchant for shorter periods of time may not suffer such levels of damage. In such cases the barrier 206 may be used to help ensure a smaller etching time and/or a more uniform etching time which may improve the quality of the fabricated structure. In some embodiments, the barrier may be a rectangular box as shown in FIGS. 7(a) and 7(b) while in other embodiments the barrier may be have a configuration that conforms to the shape of the structure or at least partially conforms to the shape of the structure so as to leave a more uniform thickness of sacrificial material for the final etching operation or operations to remove. In some embodiments, the barrier may have a substantially uniform thickness while in others the barrier may have a varying thickness, for example, if only the inner surface conforms to the shape of the desired structure.

In this process, the etching of the sacrificial material is preferably performed with an etchant that doesn't attack the structural material though it may be performed with an etchant that has a much slower rate of attack (e.g. greater than about 10 times slower and more preferably greater than about 100 times slower) on the material of barrier 206 than on the material of 208. Once the barrier 206 is reached, etching is stopped and some other post layer fabrication activities may occur. The structural material of 206 can then be etched using a selective etchant that doesn't attack the sacrificial material of 204 (or attacks it at a much slower rate). Additional post layer fabrication activities can occur at this point if desired and then when ready a final etch of the sacrificial material can occur to expose or release the desired multi-layer structure 202.

Figure 7C:
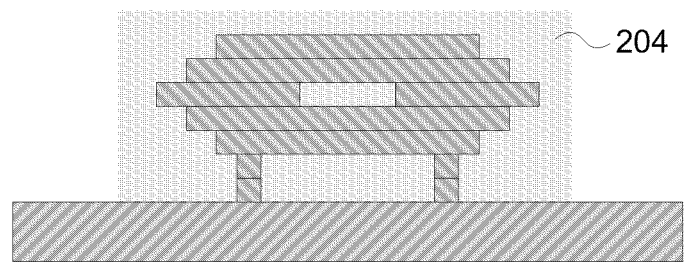
Figure 7D:
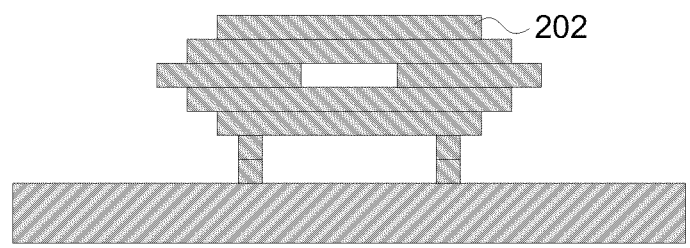

In some embodiments the sacrificial material may be copper and the structural material may be nickel, and as such the etchants may be appropriately selected to etch one but not the other. For example, the nickel etchant may be Rostrip® nickel stripper M-7 from Atotech of Enthone-OMI while the copper stripper may be Enthone C-38 from New Haven, Conn. More particularly the sacrificial material etchant (e.g. copper etchant) may be chosen such that it does not significantly attack the structural material (e.g. nickel) while the structural material etchant need not have the same differential in selectivity as any slight to moderate damage to the sacrificial material will not be significant so long as removal of sacrificial material by the structural material etchant doesn't cause the etchant to inadvertently reach the body of the desired structure. Various stages in the multioperation etching process are exemplified in FIGS. 7(b)-7(d). FIG. 7(b) depicts the stage after the removal of the outer sacrificial material 208, FIG. 7(c) depicts the stage of processing after removal of the barrier 206, and FIG. 7(d) depicts the final stage where the desired structure 202 is released from sacrificial material 204. In some alternative embodiments, use of multiple barrier layers is possible.

In some other embodiments the sacrificial material, for example, may be nickel while the structural material may be copper. The M-7 and C-38 strippers may be used. It is noted that the M-7 stripper can attack copper so it may be desirable to ensure that the stripper does not reach some portions of the desired structure 202 much sooner than it reaches other portions of the structure. In such embodiments, use of a conformable barrier or at least a barrier having an inner surface that is at least partially conformable to the surface of the desired structure may lead to more uniform etch time and thus a decrease in risk of damaging the desired structure.

Figure 8A:
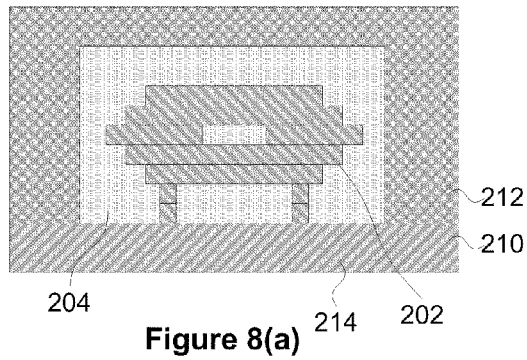
FIGS. 8(a)-8(c) schematically provide side views illustrating various stages of another embodiment of the invention.
Figure 8B:
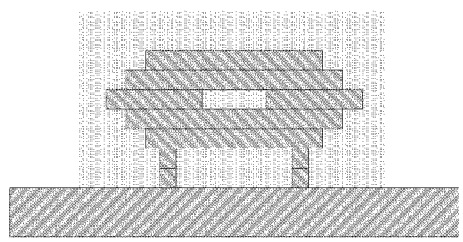
Figure 8C:
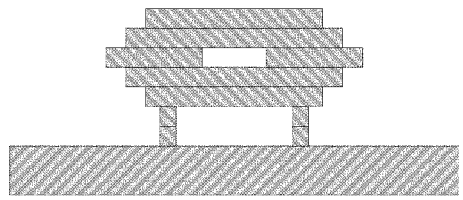

FIGS. 8(a)-8(c) depict an example where two different sacrificial materials are used along with a structural material. In this process a stop point is still achieved during the etching process and the number of etching operations are reduced to two instead of three as in the embodiment illustrated in FIGS. 7(a)-7(d). It is possible that the outer sacrificial material may be the same as the structural material. In FIG. 8(a) a desired multi-layer structure 202 is surrounded completely by a first sacrificial material 204 (with the exception of the contact area with the substrate 214) which in turn is surrounded completely by a second sacrificial material 212 (with the exception of the contact area with the substrate 214). A first etch is used to remove the second sacrificial material 212 and a second etch is used to remove the first sacrificial material 204. In different embodiments desired post layer fabrication processes can occur before the etching operations, between the etching operations, or after the etching operations.

In some embodiments, the inner surface of the second sacrificial material 212 and the outer surface of the first sacrificial material 204 may be conformable or partially conformable to the surface of the desired structure 202 so that etching time to remove the first sacrificial material is made more uniform. In some embodiments, analysis of the geometry dependence of etching rates may be used to derive a configuration for the interface of the first and second sacrificial materials that leads to a desired level of uniformity in etching rate (i.e. removal of sacrificial material so that the desired structure is exposed to etchant along all or most surfaces at about the same time) where the resulting configuration deviates from a conformable surface at least in part due to one or more geometry based etching rate dependencies such as limited etchant access in certain regions, limited flow of etchant in certain regions, tendency for etchant to become saturated in certain regions, and the like.

Figure 9A:
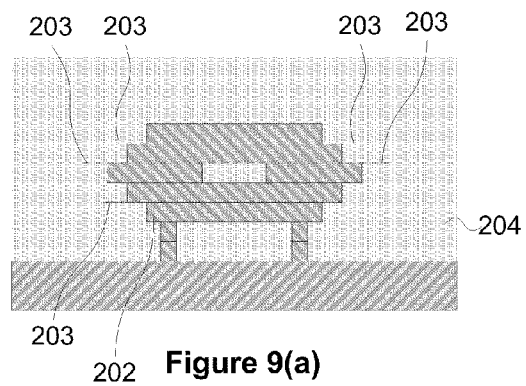
FIGS. 9(a)-9(c) schematically provide side views illustrating various stages of another embodiment of the invention which may be used to correct a fabrication defect.
Figure 9B:
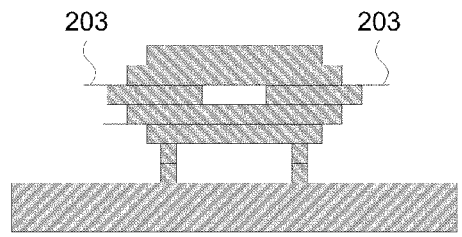
Figure 9C:
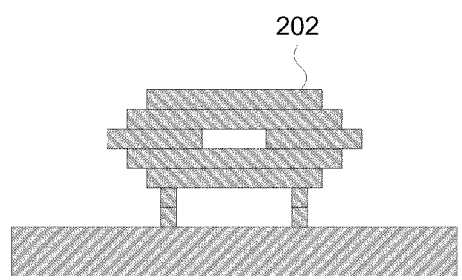

FIGS. 9(a)-9(c) illustrate an example where a desired multi-layer structure 202 is formed with imperfections 203. These imperfections are shown as very thin "streamers" formed from the same material as structure 202. These imperfections may result from the structural material being plated underneath ill seated CC masks or adhered masks that have not been adequately attached to the substrate or previously formed layer (this phenomenon may be termed "flash"), from the structural material being smeared into the sacrificial material during planarization processes (this phenomenon may be termed "smear"), or from the structural material being plated into cracks within the sacrificial material (this phenomenon may be termed "ribbons" and typically results in structures that are vertically elongated and elongated in one lateral dimension but very thin in the other lateral dimension). A first etching operation results in the removal of the sacrificial material 204 as depicted in FIG. 9(b) but leaves behind the imperfections. Since the imperfection are very thin, a structural material etchant may be used to remove the imperfections while doing little damage to the desired portion of structure 202 as shown in FIG. 9(c). As the etchant being used to attack the imperfections also attacks the structure 202, it is important that etching time be controlled. For enhanced control the selected etchant may be used in a diluted form (i.e. concentrations of the etchant that are less than those recommended or largely recognized as appropriate for the given etchant, e.g. 50%, 25%, 10%, or even less of the recommended concentration range) or at sub-normal temperatures (i.e. temperatures below those recommended or largely recognized as appropriate for the given etchant, e.g. temperatures 5° C., 10° C., 20° C. or more degrees under that recommended temperature range).

FIG. 10(a) depicts a block diagram of a fourth group of embodiments. In this group of embodiments, as with the example of FIGS. 7(a)-7(d), an etching barrier is formed out of a barrier material which may be the same as one of the structural materials or it may be different. The barrier material is chosen based on the fact that the sacrificial material may be etched without etching through the barrier material even though in some embodiments it would be acceptable if the barrier material were damaged by the etchant. In some embodiments of this group, the etching barrier may form a permanent part of a structural element even though its configuration was not part of the intended design. In these embodiments, the configuration of the barrier material does not adversely affect the usability of the intended structure. In some of these embodiments the barrier material may include both a removable element as well as an element that will become a permanent part of the structure. In some of these embodiments, the removable part of the barrier may be removable by, for example, etching operations, planarization operations, or other machining operations. In some embodiments, unlike the example of FIGS. 7(a)-7(d), the etching barrier may be constructed to allow etching access to a portion of the structure while inhibiting etchant from reaching a different portion of the structure.

The process of FIG. 10(a) begins with Operation 1, designated with reference number 242. Operation 1 calls for the formation of a plurality of layers such that three results are achieved: (1) a desired structure is formed from at least one structural material; (2) a sacrificial support structure is formed from at least one sacrificial material; and (3) an etch barrier is formed out of a barrier material where the etch barrier includes a removable element and may also include a permanent structural element.

After performance of Operation 1 the process moves forward to Operation 2, element 244, which calls for, optionally, adding on of any additional desired etching barrier elements. Such barrier elements may be positioned at desired locations and held in place in any appropriate manner, for example, by adhesion, pressure, retention clips, or the like. These additional barrier elements may be conductive materials or dielectric materials, rigid materials, or conformable materials.

After Operation 2 is completed, the process moved forward to Operation 3, element 246, which calls for the performance of one or more etching operations which may or may not be intermixed with various desired intermediate operations. From Operation 3 the process moves forward to Operation 4, element 248, which calls for removal of at least one etching barrier.

After Operation 4 is complete, the process moves forward to Operation 5, element 250, which calls for the performance of one or more additional etching operations which may or may not be intermixed with various other operations. The completion of Operation 5 may result in the completed release of the desired structure from the sacrificial material or alternatively release may not yet be completed and the process may loop back to element 244, Operation 2, or element 248, Operation 4.

FIG. 10(b) depicts a process block diagram for a fifth group of embodiments where an etching barrier is again used but where the etching barrier is either not attached to the structural material or substrate or is attached to the structural material or substrate in an easily removable manner. Such attachment would generally be of a minimal nature and would be intended to inhibit accidental release of the barrier material until such a time that it could be safely removed. Alternatively, the minimal attaching structure could ensure that movement of the etching barrier does not adversely impact further etching operations. Examples of minimal attachment structures could be very thin, horizontal or vertical extending web-like or post-like structures. Detachment of the barrier material could occur by gripping the material and snapping the fragile post or web like elements. The thin element could possibly be destroyed by passing an electric current through them or they could possibly be removed by a controlled etching operation which may attack only the barrier material or it may attack both the desired structure and the attachment elements of the barrier material which are preferably delicate enough they will be removed prior to an intolerable damage to the desired structure occurring.

The process of FIG. 10(b) begins with Operation 1, element 262. Operation 1 calls for the formation of a plurality of layers such that: (1) a desired structure is formed which includes at least one structural material; (2) a sacrificial support structure is formed and includes at least one sacrificial material; and (3) the formation of at least one etch barrier out of a barrier material where the etch barrier is either not attached to the desired structure or is attached to the desired structure in an easily removable manner.

From Operation 1 the process moves forward to Operation 2 and then to Operation 3 which are the same operations called for in the process of FIG. 10(a) and are given like reference numerals.

The process then moves forward to Operation 4, element 264, which calls for removing at least one etching barrier with or without the stopping of the etching of Operation 3. The removal of the etching barrier will allow a significant enhancement to the etching process in the region that was previously protected by the barrier. The completion of Operation 4 may represent the completed release of the desired structure from the sacrificial material or alternatively it may represent the reaching of an interim state from which the process may loop back to Operation 2 or otherwise continue in a different manner. In some embodiments Operation 3 would be stopped, a different operation performed (e.g. filing the etched region with a dielectric.

The embodiments of the processes of FIGS. 10(a) and 10(b) may be used in a variety of circumstances. Some such circumstances may involve the desire to locate dielectric materials or other infiltrated materials at select locations while still retaining at least some sacrificial material in place so as to keep different portions of a structure from moving relative to one another prior to their being locked in position by an infiltrated material.

Certain devices and structures that are electrochemically fabricated require or would benefit from dielectric or other material used as part of the structure, or require that their elements remain in a particular geometrical relationship with one another (e.g., as designed), rather than be distorted by stresses, inertial forces, thermal effects, and so forth. The use of another structural material to constrain the movement of elements composed of a primary structural material may be desirable in some cases. Despite these benefits, in some embodiments, it may not be desirable to incorporate such a secondary or tertiary structural material on a layer-by-layer basis during fabrication.

RF coaxial components made using electrochemical fabrication as disclosed in U.S. patent application Ser. No. 10/309,521, filed Dec. 3, 2002, by Brown et al., entitled "Miniature RF and Microwave Components and Methods for Fabricating Such Components" and published as US 2003-0222738 A1 and U.S. patent application Ser. No. 10/607,931, filed Jun. 27, 2003, by Brown et al, entitled "Miniature RF and Microwave Components and Methods for Fabricating Such Components" provide examples of devices that may benefit from a combination of partial etching, infiltration, completed etching, and potentially a further infiltration. These devices (e.g. coaxial devices) may benefit in terms of performance or characteristics from a dielectric (or other) material filling the space between the center conductor and shield as they may otherwise be subject to shorting, which would render the devices useless, due to the thin, poorly-supported center conductor coming into contact with the shield. Indeed, even if there is no such contact, performance can be compromised if the gaps between central conductor and shield are not as-designed.

Figure 11:
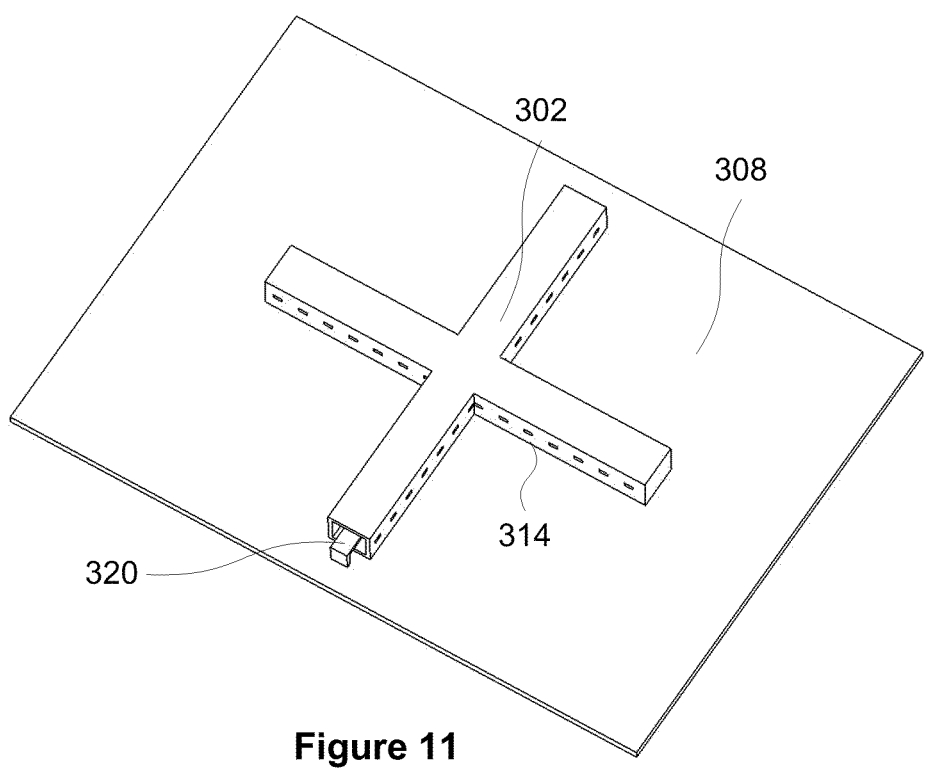
FIG. 11 depicts a perspective view of a coaxial RF device that may be electrochemically fabricated and could benefit from a post process multi-step, multi-stage, or multi-operation release of the structural material.

FIG. 11 shows a structure similar to some of the coaxial devices set forth in the '521 and '931 applications, but simplified for purposes of illustration. After the structure in FIG. 11 is released by removal of sacrificial material, in principle a dielectric material can then be introduced. Such introduction may be achieved by allowing it to wick into the gap between center conductor 320 and shield 302 by introducing it at an open end of the structure or through etching holes 314. Alternatively, the introduction may occur by subjecting the structure to a vacuum covering the structure with a flowable material and then letting a gas bleed into the vacuum chamber so as to force the flowable material into the openings in the shield 302. However, if the center conductor has already moved from its desired position, introducing the dielectric material may not improve the situation.

The process of FIG. 10(a) may be applied to ensure the structure is appropriately fabricated. By etching a structure such as that in FIG. 11 in two stages, it is possible to introduce a new material (e.g., a dielectric) into at least part of the region etched during the first stage, before continuing on to the second stage of etching. Specifically, in the case of the coaxial device of FIG. 11, the portion of the inner conductor 320 that is located at the intersection of the two arms of the device may benefit significantly if this intersection point is retained at its intended position. Thus, in this example, it is desirable to stabilize the position of a portion the structure relative to the position of another portion the structure (e.g. the central conductor 320 position relative to the position of the shield 302 near the intersection of the arms of the device) by introducing dielectric material between the center conductor and shield in a desired region prior to the final etch. After which the remaining sacrificial material will be etched and if desired, additional dielectric can be introduced into the rest of the regions between the shield 320 and central conductor or even to capsulate the entire structure with the possible exception of central conductor and shield contact regions.

Figure 12A:
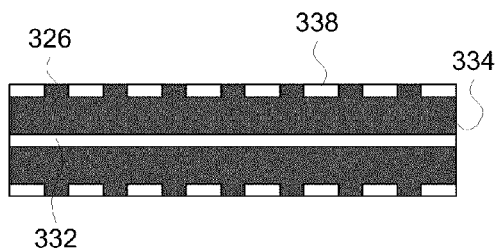
FIGS. 12(a)-12(e) schematically depict various stages of an etching and infiltration process as seen on a horizontal plane (a plane parallel to the plane of the substrate) mid way through a coaxial transmission line similar to one of the four branches of the coaxial device of FIG. 11 where a central conductor can be seen along with etching holes that extend through each side of the outer conductor.
Figure 12B:
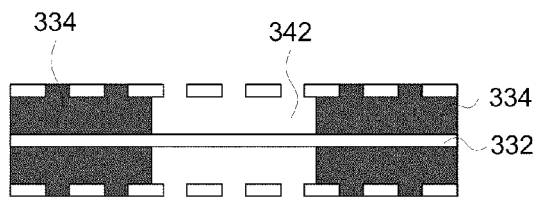
Figure 12C:
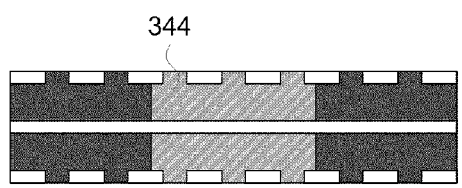
Figure 12D:
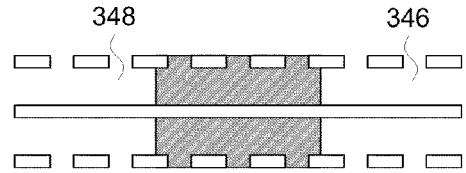
Figure 12E:
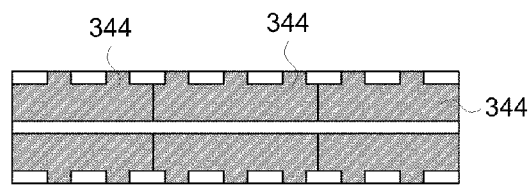

A preferred approach is exemplified schematically in FIGS. 12(a)-12(e). In FIG. 12(a), a plane of a portion of the coaxial element is shown from a top view where the plane is chosen to intersect the plane of central conductor 332 (320 in FIG. 11) as well as the etching and infiltration holes 326 (314 in FIG. 11) with a sacrificial material 334 filling the space between center conductor 332 and outer conductive shield 338 (302 in FIG. 11). In some embodiments sacrificial material may also be located outside the shield. In FIG. 12(b), one region 342 of the interior of the coaxial element is shown as having been etched out while leaving some sacrificial material 334 in place to stabilize the central conductor 332 thereby preventing it from moving out of position. Next, the etched region 342 is filled with a dielectric material 344 as shown in FIG. 12(c). With the dielectric material 344 now stabilizing the central conductor 332, it is now possible to etch out the remaining sacrificial material 334 leaving open internal regions 346 and 348 as shown in FIG. 12(d). Finally, if desired, the resulting open internal spaces may be filled with the same, or with a different, dielectric 344 as shown in FIG. 12(e).

The etching and infiltration approach exemplified in FIGS. 12(a)-12(e) may be achieved in different ways. For example, such approaches may involve etching performed in two or more stages.

Figure 13:
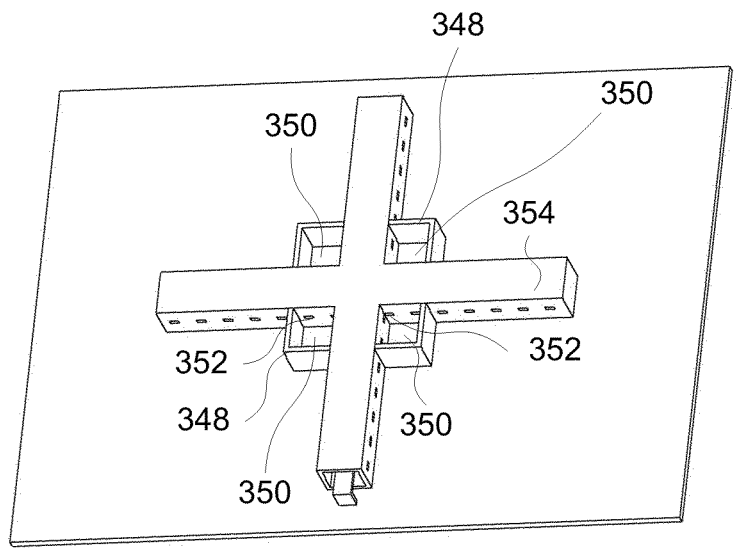
FIG. 13 depicts a perspective view of the coaxial device of FIG. 10 with an additional shielding structure forming a "chimney" around the central portion of the structure.
Figure 14A:
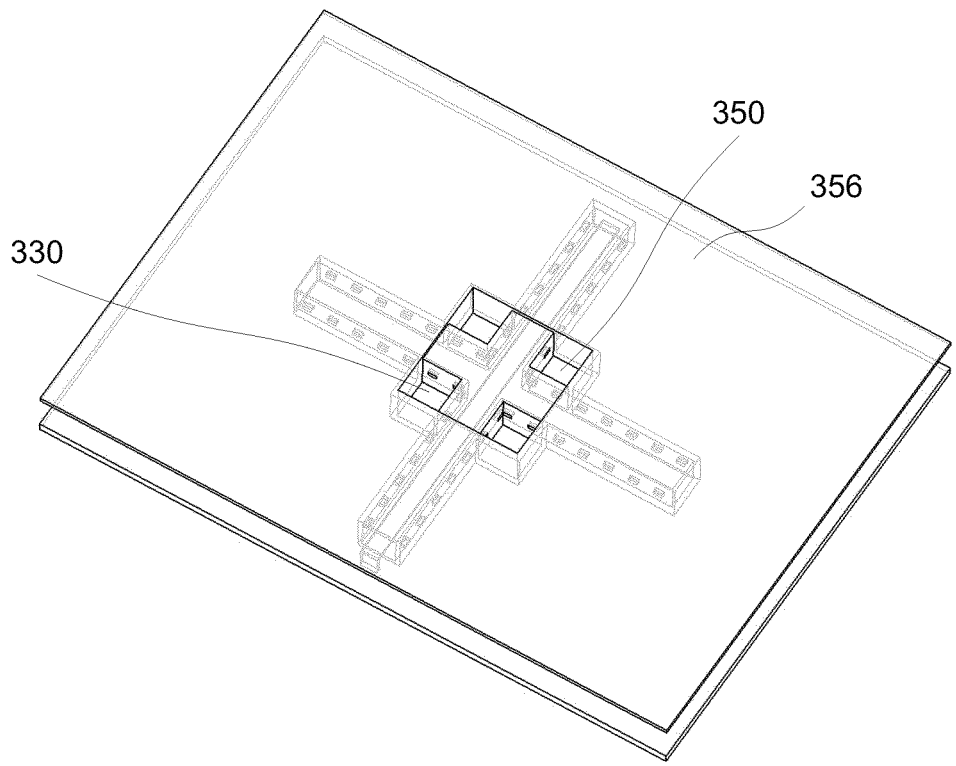
FIGS. 14(a) and 14(b) depict the structure of FIG. 12 with the addition of a temporary etch stop layer (shown in FIG. 14(a) as partially transparent and in FIG. 14(b) as opaque) that shields the distal regions of the arms of the structure which are outside the "chimney" region.
Figure 14B:
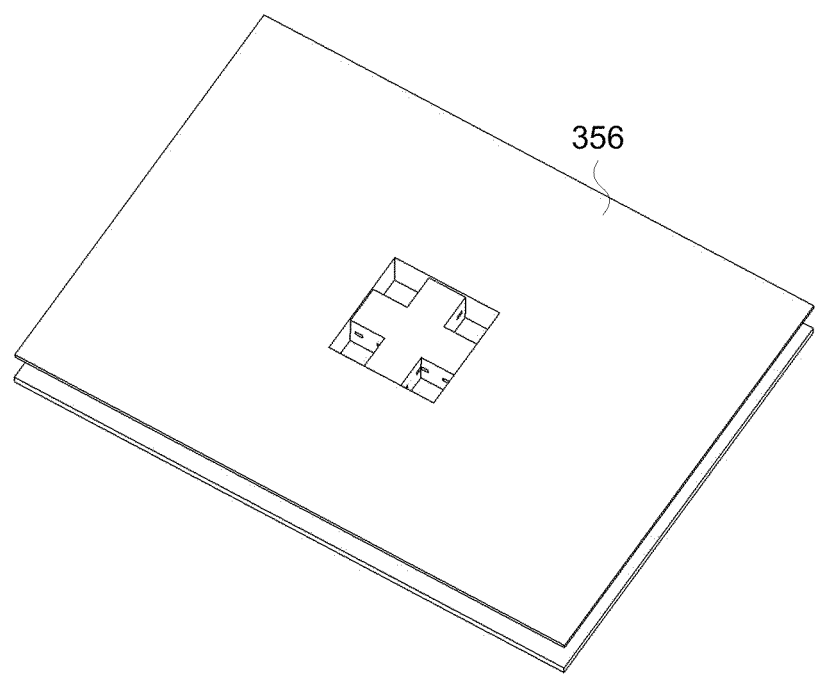

A first example of an etching and infiltration embodiment is explained with the aid of FIGS. 13 and 14(a) and 14(b). In this example, a substantially complete shielding of selected regions not to be etched is provided (with the exception of inside the structure itself) such that etching will occur only in the unshielded regions. Etching then occurs. After the initial etching is performed, infiltration occurs which provides dielectric support to a desired region. Next the shielding is at least partially removed then etching of originally shielded regions occurs, and if desired, dielectric infiltration of the originally shielded regions occurs. More specifically in the present example, the shielding includes a permanent structure which is part of the desired structure, a permanent structure that is not part of the design's desired or required functionality but which is added as a processing convenience, and a temporary shielding structure that is removed after use.

First a selected chimney region 350 (e.g. the crossing or intersecting region) to be preferentially etched is surrounded by a "chimney" structure 348 which is made of structural material. The chimney structure 348 is electrochemically fabricated along with the desired structure and it and the chimney may be seen in FIG. 13. The chimney region is further defined by a sheet of structural material 356 which can be seen in FIG. 14(a). The sheet may be formed as a layer of the structure (e.g. it may be called a temporary layer) or it may be added to the structure after layer formation. The sheet has an opening over the chimney region 350. The chimney region allows preferential etching while the chimney structure and sheet shield the sacrificial material elsewhere and serve as an etch stop. FIG. 14(a) shows the temporary layer over the structure of FIG. 13, with the entire structure including the sacrificial material shown as if partially transparent. The sheet (i.e. temporary layer) is fabricated like any layer, and may be bonded to the side walls of the chimney structure until it is planarized away or otherwise removed in a later operation.

Next a time-controlled etch is performed on the structure of FIG. 14(a) which removes the sacrificial material within the central chimney region, including the region between the center conductor and shield as a result of etchant entering the etching holes 352 in the sides of the shield. If the etch is stopped once the central conductor is reached, remaining sacrificial material somewhat outside the etching shield regions will be remain in place holding the inner conductor in place. The state of the process is shown in FIG. 14(b) where the plate is shown as opaque.

Next, a dielectric is introduced at least between the center conductor and shield through the etch holes. The dielectric may optionally fill the chimney area as well. This etch and infiltration operation may be performed within an electrochemical fabrication apparatus by inclusion of an appropriate etching station and infiltration station.

Next, the previously formed temporary layer is removed or erased. This removal may occur, for example, by planarization, e.g. lapping. Alternatively, the removal may occur by etching using an etchant that attacks the sheet but not the dielectric or the structural material forming the desired structure. The selectively between the sheet and the material of the desired structure may result from either use of a different material for the sheet and use of an etchant that is selective to that material or alternatively due to restricted access to the material of the desired structure as a result of sacrificial material that separates the sheet and the material of the desired structure. The removal of the sheet restores the structure to it open configuration similar to that of FIG. 13 with the exception of the "cross" region and potentially the chimney region being filled with a dielectric.

Next, the remaining sacrificial material is etched. This may occur after the structure is removed from an electrochemical fabrication machine (e.g. if such a machine is used in fabrication of the device) or may be performed within such a machine. Additional infiltration may be performed if desired.

Figure 15:
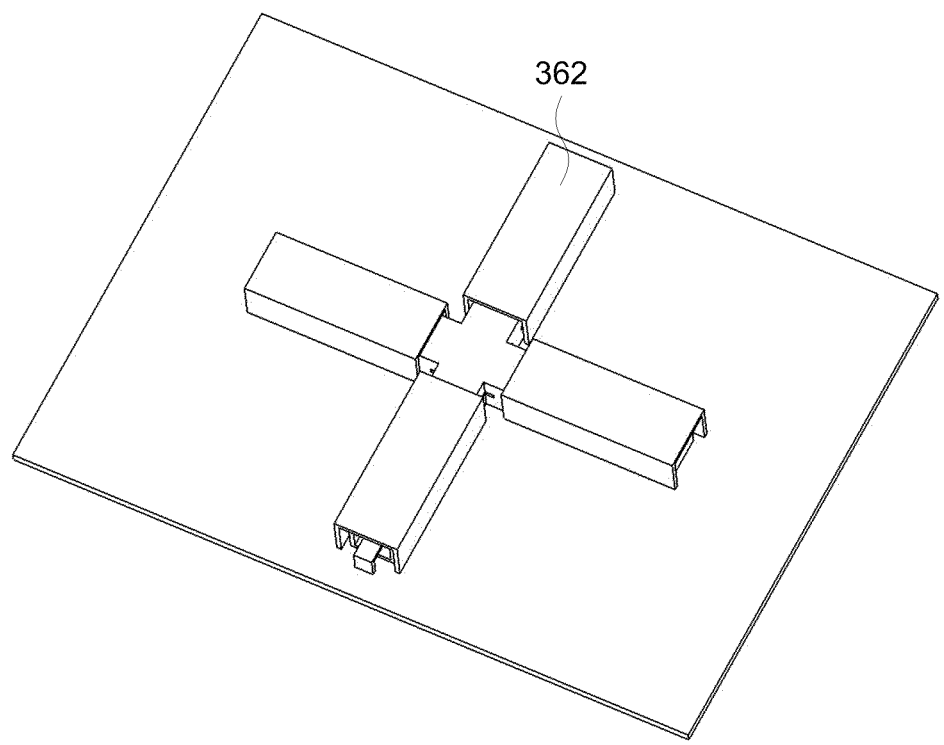
FIG. 15 depicts a perspective view of the same coaxial device of FIGS. 10 and 12-14 but with a different form of an etch barrier that aids in providing a multi-stage etching effect.
Figure 16:
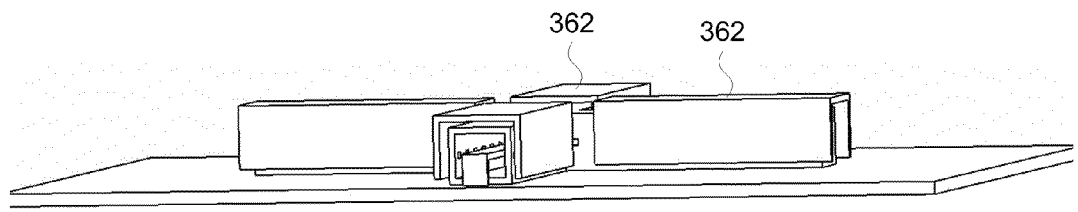
FIG. 16 depicts a view of the coaxial device of FIG. 15 where the inside portion of an arm is more clearly visible and it can be seen that the etching barrier doesn't extend completely to the substrate.
Figure 17A:
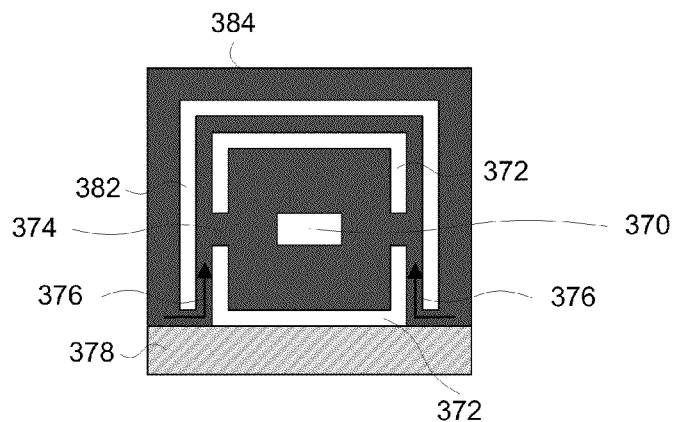

A second example of an etching and infiltration embodiment is explained with the aid of FIGS. 15, 16, and 17(a). In this example incomplete shielding is provided (i.e. shielding that doesn't completely block entrance of etchant) in some areas to slow the etching in those regions such that a differential etching rate is achieved between shielded and unshielded regions. More particularly in this example, shielding barriers do not adhere to structural material that remains as part of the structure and they do not adhere to the substrate. The barriers in this example are surrounded by sacrificial material such that once all surrounding sacrificial material is etched, the barriers can be removed or can fall away from the structure (e.g. if the structure is etched up-sided down) and thereby allow or cause a differential in etching in the initially shielded regions to occur. As a result of the shielding delays, etching preferably reaches completion in some regions while not reaching completion in other regions. The initial etching can then be terminated, the structure cleaned, infiltration performed in selected regions (e.g. the regions where completion of etching occurred), etching reinitiated and continued until etching completion is reached in all regions and then a subsequent infiltration may be performed if desired. In still other embodiments, more than two etching stages may be used in combination with two or more infiltrations being performed.

In some embodiments, the shields may be configured to form etching paths of extended length that the etchant must travel along to get to a desired etching location (i.e. etching is delayed as a result of the extended path length). In other embodiments etching delays may be achieved not based so much on extending the length of the path but instead based on diminishing the sizes of the openings through which the etchant must travel to access a desired etching location (i.e. etching is delayed based on diminished etching of flow path cross-section). In still other embodiments, etching delays may be based on a more balanced combination of these two alternative approaches. In some embodiments etching barriers may have substantially solid walls where etchant is only allowed to work on removing the shielding by working around the perimeter of the shields, while in other embodiments the walls may be perforated with holes such that the etchant can work on removing the barrier in a less path oriented manner.

In a second approach, etch barriers are fabricated along with the device which greatly slows the etching in the region of the device outside the crossing or intersecting regions of the arms. Eventually, these barriers become completely released and can be removed from (or fall away from) the device. The advantage of the second approach is that no planarization operation or other operation is required to remove the temporary layer as was required by the first approach. As a result, it is easy to perform the entire release and infiltration process outside any electrochemical fabrication machine that may be used in fabricating the structure.

FIGS. 15, 16, and 17(a) show an RF component similar to that of FIG. 11 but instead of using a chimney structure as was used in FIGS. 12, 13, and 14(a) and 14(b), an etch barrier 362 is designed so as to substantially but not completely surround selected portions of the component. In this example the etch barrier 362 surrounds each of the four 'arms' of the component while leaving the intersecting region of the four arms open so that this central regions is more directly exposed to the etchant. Where the barriers are present, the etchant must first etch out the material between the barrier and the external surface of the shield before the etchant can access the holes in the sides of the outer conductor and thereby begin the inward journey to the central conductor. After a first-stage etch which is timed or otherwise controlled to remove material between the center conductor and the shield in the intersecting or crossing region, dielectric can be introduced into this central region, after which etching can continue until all sacrificial material is removed. At some point during the etching, the barriers will be released and can be allowed to fall away (assuming etching occurs in an upside down manner) or may be otherwise removed. Since in this design the only etching holes are in the side walls of the coaxial device, the tops of the etch barriers might be deleted, so that only two vertical walls are needed, although that will accelerate their separation from the device.

FIG. 17(a) illustrates an end view of one of the arms where the end of a central conductor 370 can be seen which is surrounded by the outer conductor 372 of the coaxial line which outer conductor includes etching holes 374 which cannot be accessed until sacrificial material along paths 376 is removed, and still cannot be openly accessed until all sacrificial material between barrier 382 and outer conductor 372 is removed and barrier 382 is removed.

Figure 17B:
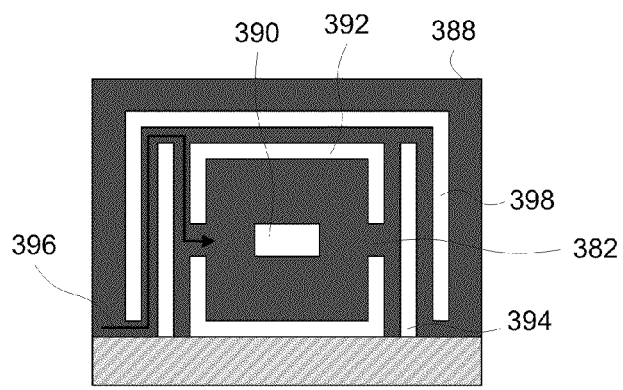
FIG. 17(b) depicts an end view of the same structure but with a double etching barrier.

FIG. 17(b) illustrates a coaxial element including central conductor 390 and outer conductor 392 filed with etchant 388 along with surrounding barriers 394 and 398. The barriers taken together result in an etching path 396 to reach openings 382 being extended considerably compared to that illustrated in FIG. 17(a). In some embodiments, such added delays may be necessary or desired to ensure complete etching of the material in the intersecting region.

FIGS. 18(a) and 18(b) depict block diagrams for two different groups of embodiments that use multi-stage etching operations for etching sacrificial material from a multi-layer structure that is formed on a substrate where the substrate itself a sacrificial material, e.g. located in passageways and the like, and/or a component that is attached to the multi-layer structure that includes a sacrificial material (e.g. located within passageways and the like). These embodiments may be useful in a variety of circumstances. For example, the embodiments associated with the process of FIG. 18(a) may be useful for minimizing the amount of time that the multi-layer structure is exposed to etchant when a larger amount of time is needed to remove sacrificial material from the substrate or other component than is required to remove sacrificial material from the multi-layer structure. The converse is true for embodiments related to the process of FIG. 18(b).

The process of FIG. 18(a) begins with Operation 1, element 402, which calls for the formation of a structure from a plurality of layers where the structure is formed on a substrate that has material to be etched or is attached to a component that contains material to be etched. The layers include a structure of desired configuration formed from at least one structural material and they include a sacrificial support structure which is formed from at least one sacrificial material.

After formation of the structure, or during formation of the structure, the process moves forward to Operation 2, element 404. Operation 2 calls for the formation of a barrier element, either in conjunction with Operation 1 or alternatively after completion of Operation 1.

From Operation 2 the process moves forward to Operation 3, element 406. Operation 3 calls for performing one or more etching operations with or without those operations being separated by intermediate operations and where the etching operations remove at least part of the sacrificial material from the substrate or component.

After Operation 3 the process moves forward to Operation 4 which calls for the removal of at least one etching barrier which was protecting, at least in part, the materials making up the multi-layer structure.

From Operation 4 the process moves forward to Operation 5, element 410. Operation 5 calls for the performance of one or more additional etching operations to remove sacrificial material from the plurality of layers of the multi-layer structure and where the etching operations may or may not be separated by the performance of intermediate operations.

The process of FIG. 18(b) is similar to that of FIG. 18(a) with a few minor changes. Whereas Operation 2 of the process of FIG. 18(a) formed or called for an etching barrier that protected the material of the multi-layer structure, Operation 2 of FIG. 18(b) calls for an etching barrier that protects the substrate or component from initial attack by an etchant.

Operation 3 of the process of FIG. 18(b) is similar to Operation 5 of the process of FIG. 18(a) wherein etching operations are performed to remove sacrificial material from the plurality of layers making up the multi-layer structure.

Operation 4 in each of the processes of FIGS. 18(a) and 18(b) are similar in that they call for the removal of the etching barrier.

Operation 5 of FIG. 18(b) is similar to Operation 3 of FIG. 18(a) in that it calls for the performance of one or more etching operations to remove material from the substrate or component.

In these groups of embodiments, the fifth operations may complete the release of the structure and substrate or component from the sacrificial material or alternatively these operations may be followed by additional operations that will complete the process.

It should also be understood that Operation 5 of FIG. 18(a) may not only involve etching of the sacrificial material from the plurality of layers but may also involve the etching of sacrificial material from the substrate or component. Similarly, Operation 5 of FIG. 18(b) may not be limited to removing sacrificial material from the substrate or component but may also involve removal of additional sacrificial material from the plurality of layers making up the structure.

An example embodiment, following the process of FIG. 18(a) is depicted in FIGS. 19(a)-19(e).

Figure 19A:
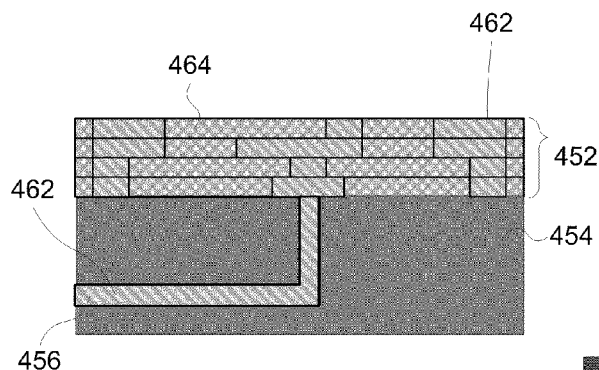
FIGS. 19(a)-19(e) schematically depict side views of an implementation of the process of FIG. 18(a).

FIG. 19(a) illustrates a multi-layer structure 452 located on a substrate 454 where the substrate includes a passage 456 filled with a sacrificial material 462. The multi-layer structure 452 includes regions of sacrificial material 462 and regions of structural material 464. Though it would be nice to perform an etch on the sacrificial material of FIG. 19(a) to obtain the structure of FIG. 19(e) using a single operation, this may not be possible. If a long etching time is required to remove the sacrificial material 462 from passage 456, significant damage to the structural material 464 or interlayer interfaces may occur if the multi-layer structure is exposed to etchant during entire time necessary to etch out passage 456. As such, in some circumstances it may be desirable not to jump from the state shown in FIG. 19(a) to the state shown in FIG. 19(e) in a single operation. As such, in this embodiment multiple operations will occur to reach the final goal depicted in FIG. 19(e).

Figure 19B:
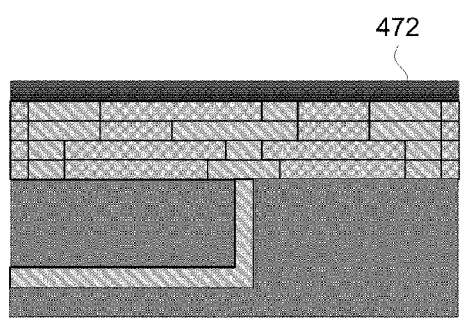

In FIG. 19(b) an additional layer 472, which is a barrier layer, is added to the multi-layer structure. This barrier layer may be formed of structural material or may be formed of a different material. It is intended that this barrier layer inhibit the etchant, which is used for removing the sacrificial material from passage 456, from reaching the structural material 464. As indicated, this barrier layer may be formed adjacent to the last layer of structure or alternatively, with the exception of connecting to an outer ring of structural material, the barrier layer may be spaced from the desired structure by one or more layers of sacrificial material. After the barrier layer 472 is put in place, an etchant is applied to the combined multi-layer structure, substrate, and barrier layer where by the etchant attacks the sacrificial material 462 located in passage 456. The etching is allowed to proceed for a time that is believed appropriate for allowing the passage to become largely free of sacrificial material or even completely free of sacrificial material.

Figure 19C:
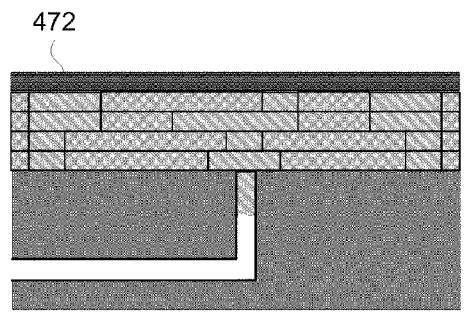
Figure 19D:
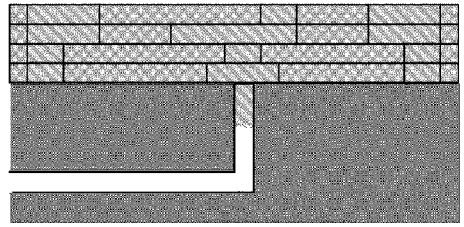

As indicated in FIG. 19(c) a small amount of sacrificial material remains in the channel near the first layer of the multi-layer structure. After the preliminary etch which substantially clears channel 456, barrier layer 472 is removed as indicated in FIG. 19(d). The removal of the barrier layer may occur via a planarization operation or via an etching operation assuming that a suitable etchant for preferentially removing the barrier layer material without damaging the structural material is possessed or assuming the structural material is separated from the barrier layer material by a sufficient thickness of sacrificial material.

Next, an etchant for removing the sacrificial material is applied whereby the etchant can remove the sacrificial material from the multi-layer structure starting at the top layer and working down while simultaneously the etchant can continue to clear the passage through the substrate whereby both the passage and the multi-layer structure are cleared of sacrificial material while maintaining the exposure of the structural material 464 to the etchant to a minimum.

Figure 19E:
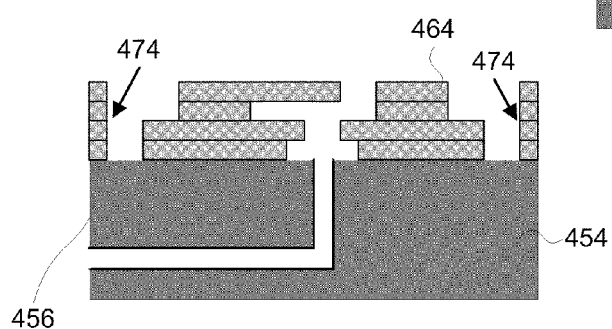

The resulting etched structure, part, component, or device is shown in FIG. 19(e). The sidewall may or may not be intended to stay with the final structure and if desired can be removed, for example by dicing before or after the final etching operation.

It will be appreciated by those of skill in the art that the approaches described herein are not limited to the particular geometries or devices described, but may be applied to a wide variety of situations in which it is desired to perform a multi-stage etch, whether for purposes of incorporating an additional material (e.g., while stabilizing a structure) or not or whether for the purpose of protecting a specific material or geometry from undue exposure to an etchant as compared to that which is needed to achieve the intended purpose. Similarly it will be understood by those of skill in the art that many variations of the above processes are possible including, for example, variations in the numbers of operations, variations in the parameters associated with the operations, variations in etchants, variations in the actual processes selected for forming a given multi-layer structure or given portion of a multi-layer structure.

Numerous alternative embodiments are possible, for example the barrier between two sacrificial materials may roughly conform to the shaped of the desired structure or it may take on some other complex shape if believed to be advantageous. In other alternatives, not all etching barriers may completely surround a desired multi-layer structure, in that certain etchants may be allowed to contact certain regions of the desired multi-layer structure but may not be allowed to contact other regions of the structure where a different structural material is present. Two, three, or more operations may be involved. Multiple structural materials may be used. In additional alternative embodiments not all materials need have contact with the substrate and not all materials need completely surround other materials. In some embodiments etching operations may be performed completely using chemical etchants while in other embodiments electrochemical etching operations may be performed.

The various multi-stage etching operations of the various embodiments of the invention may be performed for a variety of reasons. For example, such reasons include but are not limited to (1) allowing separation of multiple structures that were simultaneously formed on a common substrate prior to exposing what may be a very fragile multi-layer structure 202 to potential harm; (2) allowing a fast acting etchant to remove a large portion of the sacrificial material (which etchant may react negatively with the structural material) and then switching to a different etchant before the desired multi-layer structure is exposed; (3) allowing a more uniform etching time when the desired three-dimensional structure is exposed to the etchant; and (4) allowing one etchant to contact a certain portion of the desired multi-layer structure so as to remove one sacrificial material but not contact another portion of desired multi-layer structure as it could do damage to a second structural material in that location.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S. patent application Ser. No., Filing Date US App Pub No, Pub Date | Inventor, Title |
|---|---|
| 09/493,496 - Jan. 28, 2000 U.S. Pat. No. 6,790,377 - Sep. 14, 2004 | Cohen, "Method For Electrochemical Fabrication" |
| 10/677,556 - Oct. 1, 2003 2004-0134772 - Jul. 15, 2004 | Cohen, "Monolithic Structures Including Alignment and/or Retention Fixtures for Accepting Components" |
| 10/830,262 - Apr. 21, 2004 2004-0251142A - Dec. 16, 2004 U.S. Pat. No. 7,198,704 - Apr. 3, 2007 | Cohen, "Methods of Reducing Interlayer Discontinuities in Electrochemically Fabricated Three-Dimensional Structures" |
| 10/271,574 - Oct. 15, 2002 2003-0127336A - Jul. 10, 2003 U.S. Pat. No. 7,288,178 - Oct. 30, 2007 | Cohen, "Methods of and Apparatus for Making High Aspect Ratio Microelectromechanical Structures" |
| 10/697,597 - Dec. 20, 2002 2004-0146650A - Jul. 29, 2004 | Lockard, "EFAB Methods and Apparatus Including Spray Metal or Powder Coating Processes" |
| 10/677,498 - Oct. 1, 2003 2004-0134788 - Jul. 15, 2004 U.S. Pat. No. 7,235,166 - Jun. 26, 2007 | Cohen, "Multi-cell Masks and Methods and Apparatus for Using Such Masks To Form Three-Dimensional Structures" |
| 10/724,513 - Nov. 26, 2003 2004-0147124 - Jul. 29, 2004 U.S. Pat. No. 7,368,044 - May 6, 2008 | Cohen, "Non-Conformable Masks and Methods and Apparatus for Forming Three-Dimensional Structures" |
| 10/607,931 - Jun. 27, 2003 2004-0140862 - Jul. 22, 2004 U.S. Pat. No. 7,239,219 - Jul. 3, 2007 | Brown, "Miniature RF and Microwave Components and Methods for Fabricating Such Components" |
| 10/841,100 - May 7, 2004 2005-0032362 - Feb. 10, 2005 U.S. Pat. No. 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |

-continued

| U.S. patent application Ser. No., Filing Date US App Pub No, Pub Date | Inventor, Title |
|---|---|
| 10/434,315 - May 7, 2003 2003-0234179 A - Dec. 25, 2003 U.S. Pat. No. 7,229,542 - Jun. 12, 2007 | Bang, "Methods of and Apparatus for Molding Structures Using Sacrificial Metal Patterns" |
| 10/434,103 - May 7, 2004 2004-0020782A - Feb. 5, 2004 U.S. Pat. No. 7,160,429 - Jan. 9, 2007 | Cohen, "Electrochemically Fabricated Hermetically Sealed Microstructures and Methods of and Apparatus for Producing Such Structures" |
| 10/841,006 - May 7, 2004 2005-0067292 - May 31, 2005 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 U.S. Pat. No. 7,252,861 - Aug. 7, 2007 | Smalley, "Methods of and Apparatus for Electrochemically Fabricating Structures Via Interlaced Layers or Via Selective Etching and Filling of Voids" |
| 10/724,515 - Nov. 26, 2003 2004-0182716 - Sep. 23, 2004 U.S. Pat. No. 7,291,254 - Nov. 6, 2007 | Cohen, "Method for Electrochemically Forming Structures Including Non-Parallel Mating of Contact Masks and Substrates" |
| 10/841,347 - May 7, 2004 2005-0072681 - Apr. 7, 2005 | Cohen, "Multi-step Release Method for Electrochemically Fabricated Structures" |
| 60/533,947 - Dec. 31, 2003 | Kumar, "Probe Arrays and Method for Making" |
| 10/841,300 - May 7, 2004 2005 0032375 - Feb. 10, 2005 | Cohen, "Methods for Electrochemically Fabricating Structures Using Adhered Masks, Incorporating Dielectric Sheets, and/or Seed layers That Are Partially Removed Via Planarization" |
| 60/534,183 - Dec. 31, 2003 | Cohen, "Method and Apparatus for Maintaining Parallelism of Layers and/or Achieving Desired Thicknesses of Layers During the Electrochemical Fabrication of Structures" |
| 11/733,195 - Apr. 9, 2007 2008-0050524 - Feb. 28, 2008 | Kumar, "Methods of Forming Three-Dimensional Structures Having Reduced Stress and/or Curvature" |
| 11/506,586 - Aug. 8, 2006 2007-0039828 - Feb. 22, 2007 U.S. Pat. No. 7,611,616 - Nov. 3, 2009 | Cohen, "Mesoscale and Microscale Device Fabrication Methods Using Split Structures and Alignment Elements" |
| 10/949,744 - Sep. 24, 2004 2005-0126916 - Jun. 16, 2005 U.S. Pat. No. 7,498,714 - Mar. 3, 2009 | Lockard, "Three-Dimensional Structures Having Feature Sizes Smaller Than a Minimum Feature Size and Methods for Fabricating" |

Various other embodiments of the present invention exist. Some of these embodiments may be based on a combination of the teachings herein with various teachings incorporated herein by reference. Some embodiments may not use any blanket deposition process and/or they may not use planarization processes. Some embodiments may involve the selective deposition of a plurality of different materials on a single layer or on different layers. Some embodiments may use blanket depositions processes that are not electrodeposition processes. Some embodiments may use nickel as a structural material while other embodiments may use different materials such as gold, silver, copper, zinc, tin, or any other depositable materials that can be separated from the a sacrificial material. Some embodiments may use copper as a sacrificial material while other embodiments may use silver, zinc, tin, or other materials. Some embodiments using a nickel structural material and a copper sacrificial material which may be selectively etched using a sodium chlorite and ammonium hydroxide based etchant such as Enstrip C-38 sold by Entone-OMI of New Haven, Conn. Such an etchant may be used in a diluted form or even have components added such as corrosion inhibitors (e.g. sodium nitrate) to further improve selectivity of the process.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

We claim:

1. A method for simultaneously forming a plurality of three-dimensional structures, comprising:

(A) forming a plurality of successively formed layers, wherein each successive layer comprises at least two materials and is formed on and adhered to a previously formed layer, one of the at least two materials is a structural material and the other of the at least two materials is a sacrificial material, and wherein each successive layer defines a successive cross-section of a plurality of the three-dimensional structures, and wherein the forming of each of the plurality of successive layers comprises:

(i) depositing a first of the at least two materials;

(ii) depositing a second of the at least two materials;

(iii) planarizing the first and second materials to set a boundary level for the layer; and (B) during or after formation of the plurality of successively formed layers, locating at least one etching barrier to at least partially shield sacrificial material around a portion of the three-dimensional structures from attack by an etchant while the etchant removes sacrificial material from multiple layers around at least another portion of the three-dimensional structures;

(C) after locating the barrier and after forming the plurality of successive layers, etching away a portion of the sacrificial material from multiple layers of the structural material to reveal a portion of the three-dimensional structures, (D) after said etching away, removing the barrier;

(E) after removing the barrier, etching away another portion of the sacrificial material from multiple layers of the structural material to reveal at least another portion of the three-dimensional structures.

2. The method of claim 1 wherein during formation of at least one given layer, the step of depositing the first of the at least two materials comprises depositing a sacrificial material.

3. The method of claim 1 wherein during formation of at least one given layer, the step of depositing the first of the at least two materials comprises depositing a structural material.

4. The method of claim 1 wherein during the formation of at least one given layer the at least two materials comprise at least three materials.

5. The method of claim 4 wherein during the formation of at least one given layer the at least three materials comprise at least three different electroplated materials.

6. The method of claim 1 wherein the revealing of the structures also releases the structures from a substrate on which they were formed.

7. An electroplating method for simultaneously fabricating a plurality of multi-layer three-dimensional structures, comprising:
(A) forming a first layer comprising depositing at least a first structural material and at least a first sacrificial material and planarizing the at least one deposited first structural material and the at least one deposited first sacrificial material to set a boundary level of the first layer;
(B) forming additional layers with an initial additional layer formed on and adhered to the first layer and with subsequent additional layers formed on and adhered to previously formed additional layers, wherein the forming of each additional layer comprises depositing at least one additional structural material and depositing at least one additional sacrificial material and planarizing the at least one deposited additional structural material and the at least one additional sacrificial material to set a boundary level for each additional layer;
(C) during or after formation of the plurality of successively formed layers, locating at least one etching barrier to at least partially shield sacrificial material around a portion of the three-dimensional structures from attack by an etchant while the etchant removes sacrificial material from multiple layers around at least another portion of the three-dimensional structures;
(D) after locating the barrier and after forming the plurality of successive layers, etching away a portion of the sacrificial material from multiple layers of the structural material to reveal a portion of the three-dimensional structures,
(E) after said etching away, removing the barrier;
(F) after removing the barrier, etching away another portion of the sacrificial material from multiple layers of the structural material to reveal at least another portion of the three-dimensional structures.

8. The method of claim 7 wherein during formation of a given layer, the step of depositing the at least one sacrificial material occurs before the step of depositing the at least one structural material.

9. The method of claim 7 wherein during formation of a given layer, the step of depositing the at least one structural material occurs before the step of depositing the at least one sacrificial material.

10. The method of claim 7 wherein during the formation of the given layer the depositing of the at least one structural material and the at least one sacrificial material comprise the deposition of at least three materials.

11. The method of claim 10 wherein during the formation of the given layer the depositing of the at least three materials comprise the electroplating of at least three different materials.

12. The method of claim 7 wherein the revealing of the structures also releases the structures from a substrate on which they were formed.

13. An electrochemical fabrication process for producing a plurality of multi-layer three-dimensional structures from a plurality of adhered layers, the process comprising:
(A) forming a layer by depositing at least one sacrificial material and at least one structural material onto a substrate, wherein the substrate may comprise previously deposited layers, and wherein the depositing of at least one of the materials comprises an electrodeposition or electroless deposition operation;
(B) repeating (A) one or more times such that a plurality of layers are formed and such that successive layers are formed adjacent to and adhered to previously formed layers;
(C) locating an etching barrier to inhibit etching of sacrificial material around one or more selected three-dimensional structures during an etching operation that is intended to release one or more non-selected structures from the sacrificial material;
(D) performing a first etching operation to release the one or more non-selected structures from the sacrificial material;
(E) removing the etching barrier;
(F) after removal of the etching barrier, performing a second etching operation to release at least a portion of the selected structures from multiple layers of the sacrificial material.

14. The method of claim 13 wherein during formation of a given layer, the step of depositing the at least one sacrificial material occurs before the step of depositing the at least one structural material.

15. The method of claim 13 wherein during formation of a given layer, the step of depositing the at least one structural material occurs before the step of depositing the at least one sacrificial material.

16. The method of claim 13 wherein during the formation of the given layer the depositing of the at least one structural material and the at least one sacrificial material comprise the deposition of at least three materials.

17. The method of claim 16 wherein during the formation of the given layer the depositing of the at least three materials comprise the electroplating of at least three different materials.

18. The method of claim 13 wherein the release of the structures from surrounding sacrificial material also releases the structures from a substrate on which they were formed.

* * * * *